(12) United States Patent
Bhattacharya et al.

(10) Patent No.: US 7,465,678 B2
(45) Date of Patent: Dec. 16, 2008

(54) DEFORMABLE ORGANIC DEVICES

(75) Inventors: Rabin Bhattacharya, Ledeganckstraat (NL); Sigurd Wagner, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 265 days.

(21) Appl. No.: 11/332,231

(22) Filed: Jan. 17, 2006

(65) Prior Publication Data

US 2006/0169989 A1   Aug. 3, 2006

Related U.S. Application Data

(63) Continuation-in-part of application No. 10/822,789, filed on Apr. 13, 2004, now abandoned, and a continuation-in-part of application No. 10/402,087, filed on Mar. 28, 2003.

(51) Int. Cl.
   *H01L 21/469* (2006.01)
   *H01L 23/58* (2006.01)
(52) U.S. Cl. .................................. 438/780; 257/642
(58) Field of Classification Search ............ 438/30, 438/780, 790, 794; 257/642–643
   See application file for complete search history.

(56) References Cited

U.S. PATENT DOCUMENTS

| | | | |
|---|---|---|---|
| 2,143,649 A | 1/1939 | Dansard | |
| 3,300,572 A | 1/1967 | Dahlgren | |
| 3,576,941 A | 5/1971 | Colglazier | |
| 3,818,279 A | 6/1974 | Seeger et al. | |
| 4,435,740 A | 3/1984 | Huckabee et al. | |
| 4,475,141 A | 10/1984 | Antonevich | |
| 4,945,191 A | 7/1990 | Satsuka et al. | |
| 4,991,290 A | 2/1991 | MacKay et al. | |
| 5,207,585 A | 5/1993 | Byrnes et al. | |
| 5,244,410 A | 9/1993 | Demus et al. | |
| 5,247,190 A | 9/1993 | Friend et al. | |
| 5,399,982 A | 3/1995 | Driller et al. | |
| 5,468,159 A | 11/1995 | Brodsky et al. | |
| 5,512,131 A | 4/1996 | Kumar et al. | |
| 5,691,041 A | 11/1997 | Frankeny et al. | |

(Continued)

FOREIGN PATENT DOCUMENTS

JP   6-36620   2/1994

OTHER PUBLICATIONS

Shtein et al., U.S. Appl. No. 10/233,470, filed Sep. 4, 2002, entitled "Process and Apparatus for Organic Vapor Jet Deposition".

(Continued)

*Primary Examiner*—Calvin Lee
(74) *Attorney, Agent, or Firm*—Kenyon & Kenyon LLP

(57) ABSTRACT

A device is provided. The device includes a substrate, an inorganic layer disposed over the substrate, and an organic layer disposed on the inorganic conductive or semiconductive layer, such that the organic layer is in direct physical contact with the inorganic conductive or semiconductive layer. The substrate is deformed such that there is a nominal radial or biaxial strain of at least 0.05% relative to a flat substrate at an interface between the inorganic layer and the organic layer. The nominal radial or biaxial strain may be higher, for example 1.5%. A method of making the device is also provided, such that the substrate is deformed after the inorganic layer and the organic layer are deposited onto the substrate.

19 Claims, 30 Drawing Sheets

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,816,848 | A | 10/1998 | Zimmerman |
| 5,824,959 | A | 10/1998 | Mista et al. |
| 5,834,893 | A | 11/1998 | Bulovic et al. |
| 5,844,363 | A | 12/1998 | Gu et al. |
| 5,936,850 | A | 8/1999 | Takahashi et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,175,081 | B1 | 1/2001 | Hsieh |
| 6,195,261 | B1 | 2/2001 | Babutzka et al. |
| 6,294,398 | B1 | 9/2001 | Kim et al. |
| 6,303,238 | B1 | 10/2001 | Thompson et al. |
| 6,319,012 | B1 | 11/2001 | Moessinger et al. |
| 6,337,102 | B1 | 1/2002 | Forrest et al. |
| 6,353,188 | B1 | 3/2002 | Fernandez |
| 6,360,615 | B1 | 3/2002 | Smela |
| 6,468,819 | B1 | 10/2002 | Kim et al. |
| 6,507,989 | B1 | 1/2003 | Bowden et al. |
| 6,518,168 | B1 | 2/2003 | Clem et al. |
| 6,602,540 | B2 | 8/2003 | Gu et al. |
| 6,613,979 | B1 | 9/2003 | Miller et al. |
| 6,743,982 | B2 | 6/2004 | Biegelsen |
| 2002/0134984 | A1 | 9/2002 | Igarashi |
| 2004/0110326 | A1 | 6/2004 | Forbes et al. |
| 2004/0192082 | A1 | 9/2004 | Wagner et al. |
| 2005/0042796 | A1 | 2/2005 | Wagner |

OTHER PUBLICATIONS

Hsu et al., "Plastic Deformation of Thin Foil Substrates with Amorphous Silicon Islands into Spherical Shapes," *Mat. Res. Soc. Symp. Proc.*, vol. 621 (2000).

Hsu et al., "Amorphous Si TFTs on plastically-deformed substrates with 3-D shapes", Tech. Dig. Of the 59th Device Research Conference, Jun. 25-27, 2001, University of Notre Dame, Notre Dame, Indiana.

Hsu et al., "Amorphous Si TFTs on plastically deformed spherical domes," *J. Non-Crystalline Solids* 299-302, (2002), pp. 1355-1359.

Hsu, et al., "Thin-film transistor circuits on large-area spherical surfaces," *Applied Physics Letters*, vol. 81, No. 9, pp. 1723-1725 (Aug. 26, 2002).

R. Bhattacharya et al., "Island Edge Coverage by Metal Interconnects for Three Dimensional Circuits".

Hsu et al., "Spherical deformation of compliant substrates with semiconductor device islands," *Journal of Applied Physics*, vol. 95, No. 2, pp. 705-712 (Jan. 15, 2004).

Hsu et al., "Effects of Mechanical Strain on TFTs on Spherical Domes," *IEEE Transactions on Electron Devices*, vol. 51, No. 3, pp. 371-377 (Mar. 2004).

Wang et al., "Curved Silicon Electronics," *Mat. Res. Soc. Symp. Proc.*, vol. 769 (2003).

"Interconnecting Indium Tin Oxide Islands on a Spherical PET Surface", Symposium I Flexible Electronics—Materials and Device Technology, *Mat. Res. Soc. Symp.*, Apr. 12-16, 2004, publicly available online Mar. 22, 2004 as vol. 814.

Sturm et al., "Three-Dimensional Electronic Surfaces," *Mat. Res. Soc. Symp. Proc.*, vol. 636 (2001).

Brochure of "Southwall Altair O Transparent Conductive Film," Dec. 1995, 2 pages, Southwall Technologies, Inc., Palo Alto, CA.

Z. Suo, et al., "Mechanics of rollable and foldable film-on-foil electronics", Applied Physics Letters, vol. 74, No. 8, pp. 1177-1179, Feb. 22, 1999.

Bhattacharya et al., "Island Edge Coverage by Metal Interconnects for Three Dimension Circuits".

Wang et al., "Curved Silicon Electronics,", Materials Research Society Symp. Proc. vol. 769, 2003.

Bowden et al., "Spontaneous Formation of Ordered Structures in Thin Films of Metals Supported on an Elastomeric Polymer", Nature 393:146-49, 1998.

Benslimane, M. & Gravesen, "Mechanical Properties of Dielectric Elastomer Actuators with Smart Metallic Compliant Electrodes", Smart Structures and Materials 2002: Electroactive Polymer Actuators and Devices (EAPAD), Yoseph Bar-Cohen, Editor, Proceedings of SPIE 4695:150-57, 2002.

Kim et al., "Wave Formation by Heating in Thin Metal Films of an Elastomer", J. Poly Sci., Part B: Polymer Physics 39:1122-8, 2001.

Huang et al., "Wrinkling of a Compressed Elastic Film on a Viscous Layer", J. Appl Phys. 91(3):1135-42, 2002.

Bowden et al., "The Controlled Formation of Ordered, Sinusoidal Structures by Plasma Oxidation of an Elastomeric Polymer", Appl. Phys. Lett. 75(17):2557-9, 1999.

Chen et al., "The Fracture of Brittle Thin Films on Compliant Substrates in Flexible Displays", Engr. Fract. Mech 69:597-603, 2002.

Watanabe et al., "Wrinkled Polypyrrole Electrode for Electroactive Polymer Actuators", J. Appl. Phys. 92(8):4631-37, 2002.

Cairns et al., "Strain Dependent Electrical Resistance of Tin-Doped Idium Oxide on Polymer Substrates", Appl. Phys. Lett. 76(11)1425-7, 2000.

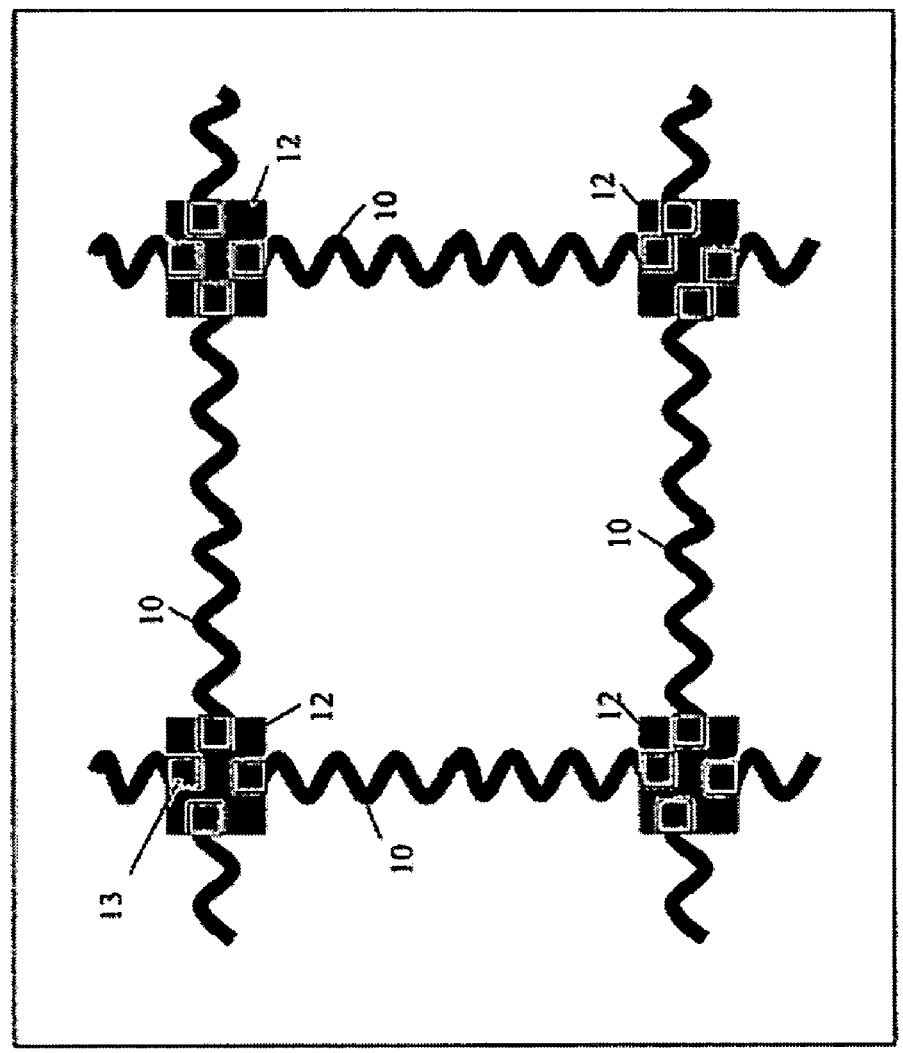

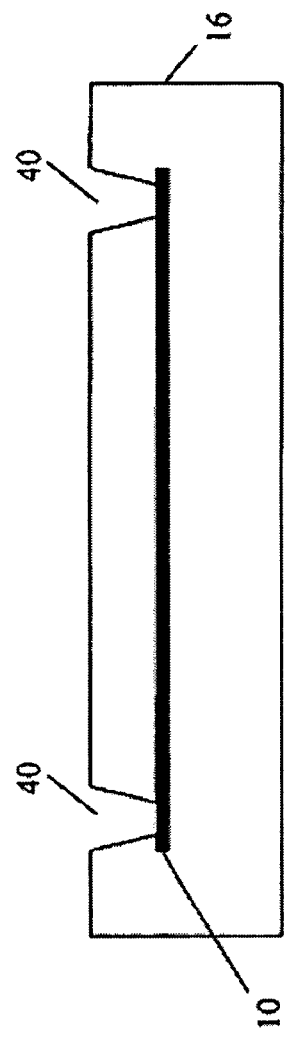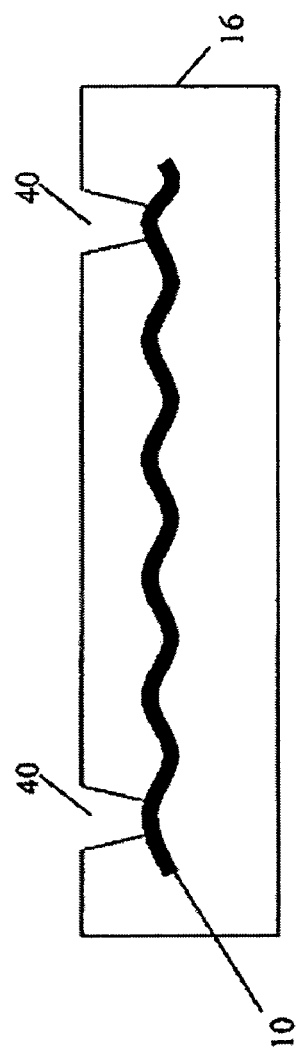

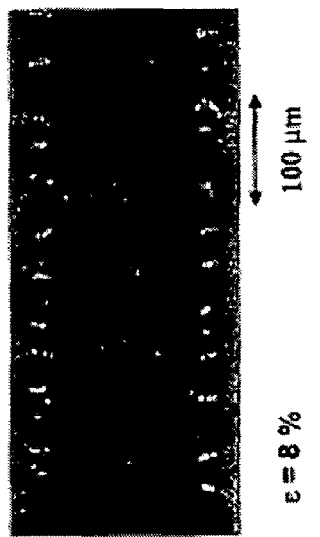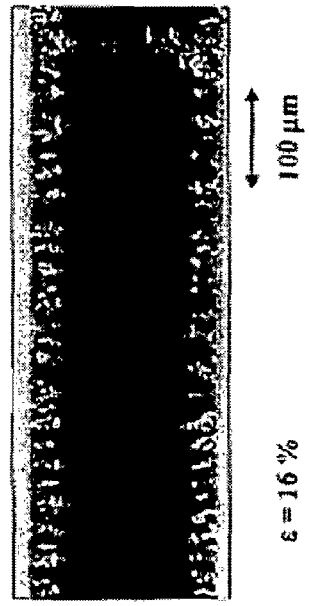

DEFORMABLE ORGANIC DEVICES

This application is a continuation-in-part of prior application Ser. No. 10/822,789, filed on Apr. 13, 2004 now abandoned, and prior application Ser. No. 10/402,087, filed on Mar. 28, 2003, both of which are incorporated by reference herein in their entirety.

GOVERNMENT RIGHTS

This invention was made with Government support under Contract No. F33615-98-5164 awarded by DARPA. The government has certain rights in this invention.

FIELD OF THE INVENTION

The present invention relates to organic devices, and more specifically to such devices that may be readily deformed into arbitrary shapes without reducing device yield or creating reliability issues.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic devices include organic light emitting devices (OLEDs), organic transistors, organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic optoelectronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

Optoelectronic devices rely on the optical and electronic properties of materials to either produce or detect electromagnetic radiation electronically or to generate electricity from ambient electromagnetic radiation. Photosensitive optoelectronic devices convert electromagnetic radiation into electricity. Photovoltaic (PV) devices or solar cells, which are a type of photosensitive optoelectronic device, are specifically used to generate electrical power. PV devices, which may generate electrical power from light sources other than sunlight, are used to drive power consuming loads to provide, for example, lighting, heating, or to operate electronic equipment such as computers or remote monitoring or communications equipment. These power generation applications also often involve the charging of batteries or other energy storage devices so that equipment operation may continue when direct illumination from the sun or other ambient light sources is not available. As used herein the term "resistive load" refers to any power consuming or storing device, equipment or system. Another type of photosensitive optoelectronic device is a photoconductor cell. In this function, signal detection circuitry monitors the resistance of the device to detect changes due to the absorption of light. Another type of photosensitive optoelectronic device is a photodetector. In operation a photodetector has a voltage applied and a current detecting circuit measures the current generated when the photodetector is exposed to electromagnetic radiation. A detecting circuit as described herein is capable of providing a bias voltage to a photodetector and measuring the electronic response of the photodetector to ambient electromagnetic radiation. These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no external bias. A photodetector has at least one rectifying junction and is usually but not always operated with a bias.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

As used herein, the term "device" is intended to be construed broadly enough to encompass structure such as interconnects that connect other devices to each other.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

Related Art

A number of electronic circuits require low resistance connections between parts that are mechanically separate and/or can move against each other. Examples include: large-area electronics that can be bent or 3-D deformed; printed wire boards with creases along which they can be folded to achieve high density; and integrated circuits that move against their packages under the influence of thermal expansion. Typically, when such movement occurs the electrical contacts between interconnects and circuits are subjected to mechanical stress. If this stress results in mechanical debonding, the circuit also fails electrically.

Photolithographically patterned stretchable interconnects for electrically connecting electronic devices which are supported for movement relative to one another have been described. U.S. patent application No. 2002-0094701 describes a stretchable interconnect formed of a coiled conductor. The coiled conductor is formed by photolithography. In this technique, a negative or positive resist (photoresist) is coated onto an exposed surface of a material. The resist is irradiated in a predetermined pattern, and irradiated (positive resist) or nonirradiated (negative resist) portions of the resist are removed from the surface to produce a predetermined resist pattern on the surface. This can be followed by one or more procedures such as etching, plating, and the like. The coiled conductor is formed of a metal or alloy having a stress gradient extending through the thickness of the conductor. The interconnects become stretchable when a supporting substrate is removed from the interconnect.

Formation of ordered structures in thin films of metals supported on an elastomeric polymer have been described in Bowden, N. et al., Nature, 393, 146 (1998). The ordered structures were spontaneously generated by buckling of thin metal films owing to thermal contraction of an underlying substrate. Films from the vapor phase are deposited on a thermally expanded polymer of polydimethyl siloxane (PDMS). Subsequent cooling of the polymer creates compressive stress in the metal film that is relieved by buckling with a uniform wavelength of 20-50 micrometers. The waves can be controlled and oriented by relief structures in the surface of the polymer to provide intricate ordered patterns. It is described that the patterning process may find applications in optical devices.

Inherent flexibility of thin-film electronics can be used in a variety of applications. One approach to making flexible and deformable structures is to use polymer substrates. The flexibility of the polymer substrate offers application opportunities that utilize curved and/or deformable surfaces. Retina-shaped photosensor arrays described in Hsu, P. et al., Appl. Phys. Lett. 81, 1723-5 (2002), electro-active polymer actuators described in Pelrine, R. et al., Smart Structures and Materials 2001: Electroactive Polymer Actuators and Devices, edited by Y. Bar-Cohen, SPIE Proc. 4329, Bellingham, Wash., (2001) pp. 334-349, or stretchable sensitive skin described in Lumelsky, V. J. et al. IEEE Sensors journal 1, 41 (2001) are electronic systems that combine electronic functions with the flexibility of plastic substrates.

Dielectric elastomer actuators with smart metallic electrodes made of silver were described in Benslimane et al., Smart Structures and Materials 2002, Electroactive Polymer Actuators and Devices, edited by Y. Bar-Cohen, 150 Proceedings of SPIE Vol. 4695 (2002). An elastomer film is spin coat on a mold for forming a corrugated quasisinusoidal profile. Thin metal films are deposited on the corrugated surfaces of the elastomer film. Since the elastomer conserves volume when it is deferred, the electrically-induced stress in the film thickness direction is converted to stress in the direction of actuation. The corrugation depth-to-period ratio is optimized in order to obtain elongation of about 33% before the metal electrode breaks.

An electrode for a bending-electrostrictive polyurethane actuator was described in Watanabe, M. et al., J. Appl. Phys. 92, 4631 (2002). The wrinkled electrode was prepared by in situ deposition of polypyrrole onto a polyurethane elastomer film that was being uniaxially drawn. After the deposition, the film was released from the drawing to make the electrode wrinkle. The bending actuator of the polyurethane film with the wrinkled electrode was improved compared to an unwrinkled one. Polypyrrole is an organic conductor, with an electrical conductivity much lower than that of typical interconnect metals, e.g., gold or aluminum. Accordingly, organic conductors have a greatly restricted applicability compared to metallic conductors.

SUMMARY OF THE INVENTION

A device is provided. The device includes a substrate, an inorganic layer disposed over the substrate, and an organic layer disposed on the inorganic conductive or semiconductive layer, such that the organic layer is in direct physical contact with the inorganic conductive or semiconductive layer. The substrate is deformed such that there is a nominal radial or biaxial strain of at least 0.05% relative to a flat substrate at an interface between the inorganic layer and the organic layer. The nominal radial or biaxial strain may be higher, for example 1.5%. A method of making the device is also provided, such that the substrate is deformed after the inorganic layer and the organic layer are deposited onto the substrate.

It has been found that thin electrically conducting films can be stretched far when they are made on easily deformable substrates. The electrically conducting films can be stretched far more than free-standing metal films and beyond predictions based on geometric concepts of stretchable films. When tightly bonded to the substrate, the electrically conducting films remain electrically conducting to high values of extension and can be used as stretchable electrical interconnections. When the substrate is an elastomer, electrical conductance is retained over multiple cycles of stretching and relaxation, and such films on elastomeric substrates can be used as elastic electrical interconnects. When the substrate deforms plastically, the film can be stretched once and retains electrical conduction. For example, the structures can be stretched by a factor of two or greater in length.

Stretchable interconnects can be made in various geometric configurations, depending on the intended application. The stretchable interconnects can be formed of an elastomer material to provide elastic properties in which the interconnects can be reversibly stretched in order to stretch and relax the elastomer material to its original configuration. Alternatively, stretchable interconnects can be formed of a plastic material to provide stretching of the material to a stretched position and retaining the stretched configuration. A stretchable interconnect may be formed of a flat 2-dimensional conductive film covering an elastomeric, polymeric or plastic substrate. When this structure is stretched in one or two dimensions, it retains electrical conduction in both dimensions.

A stretchable interconnect may be formed of a conductive stripe of a conductive material on an elastomeric or plastic substrate. The conductive stripe can be nearly one-dimensional, meaning that it is much longer than wide. When the conductive stripe is stretched, preferably along its longitudinal axis, it retains electrical conduction. Alternatively, conductive films or conductive stripes can be embedded within the elastomeric or plastic substrate.

Stretchable and/or elastic interconnects may also be formed of a film or stripe that is formed on an elastomeric or plastic substrate such that it is buckled randomly, or organized in waves with long-range periodicity. The buckling or waves can be induced by various techniques, including: built-in compressive stress in the conductive film or conductive stripe; pre-stretching the substrate prior to the fabrication of the conductive film or conductive stripe; and patterning of the surface of the substrate prior to the fabrication of the metal film.

In another configuration, a stretchable interconnect is formed of a plurality of conductive films or conductive stripes embedded between a plurality of layers of a substrate formed of an elastomer or plastic. The stretchable interconnect can include conductive stripes that run in different directions on top of an elastomeric or plastic substrate, or are embedded in it, either at a single level, or in a plurality of layers. The stretchable interconnects may also be formed of conductive films or stripes oriented in all three directions, atop or within an elastomer or plastic matrix.

Stretchable interconnects are useful for flexible and deformable electronics, and for making space-saving interconnections. Applications for stretchable and/or elastic interconnects of the present invention include: flexible and deformable electronics, in which subcircuits are connected with low resistance conductors that can be stretched or compressed once or many times; thin film metal connectors between mechanically separate circuits; and packaging of integrated circuits with stretchable interconnects that do not place the connections of the IC under mechanical load.

The invention will be more fully described by reference to the following drawings.

BRIEF DESCRIPTION OF THE DRAWINGS

FIG. 6A is a top view of an array of electronic devices connected with stretchable interconnects having a wavy profile.

FIG. 19A is a cross-sectional schematic view of a stretchable interconnect embedded in a substrate having a flat profile.

FIG. 19B is a cross-sectional schematic view of a stretchable interconnect embedded in a substrate having a wavy profile.

FIG. 25A is a photograph of a stretchable interconnect under a 8% tensile strain.

FIG. 25B is a photograph of a stretchable interconnect under a 16.4% tensile strain.

DETAILED DESCRIPTION

Figure 1:
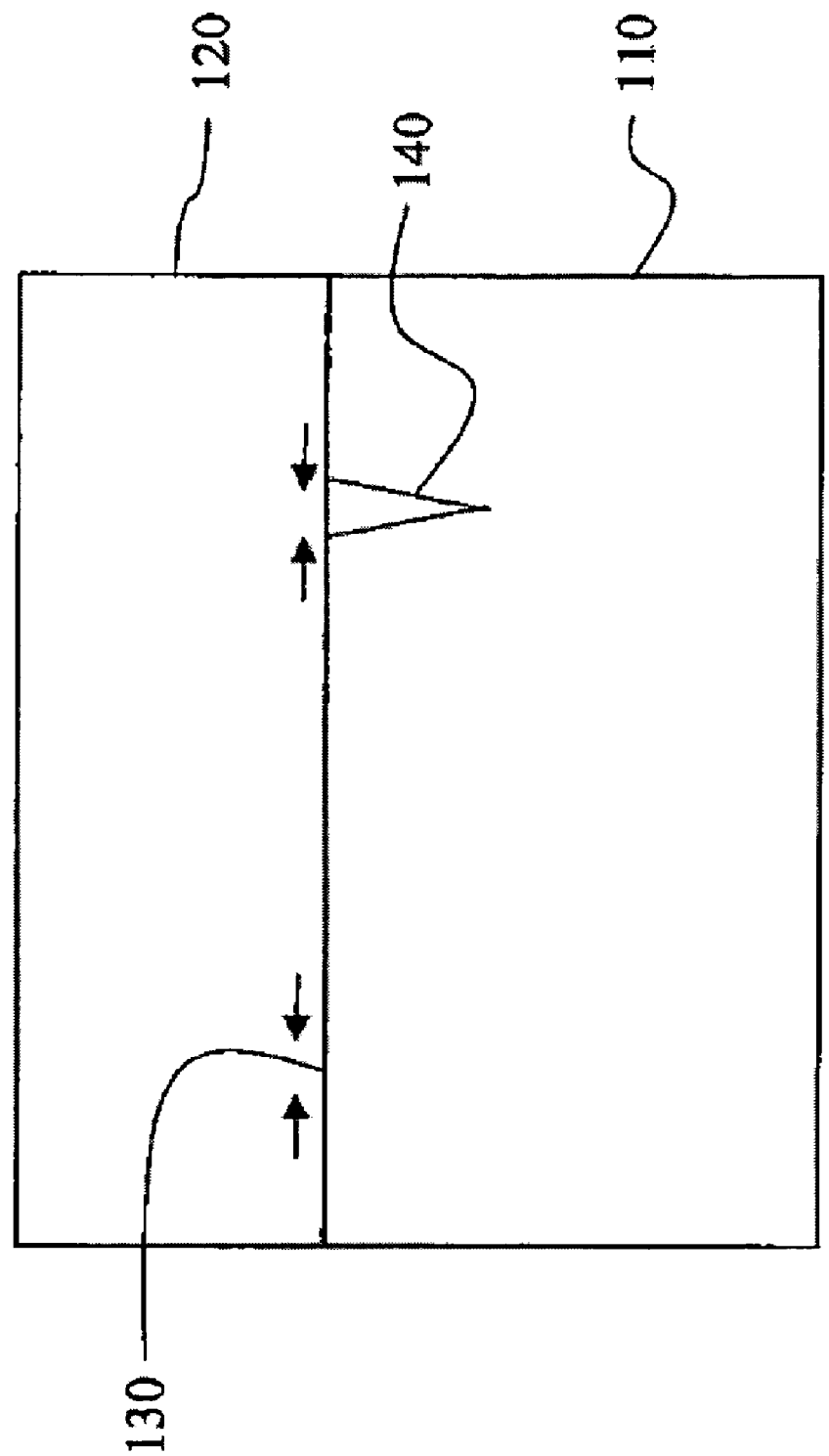
FIG. 1 shows a mechanism by which cracking may be suppressed by an organic layer.

The applications of traditional large-area electronics, such as displays, are limited by the fact that glass substrates are rigid and easily breakable. Large-area electronics, such as electronic paper, sensor skin, and electrotextiles, require building electronic devices on flexible and deformable substrates. Substrates, such as organic polymers and stainless-steel foils, can be deformed into arbitrary shapes, but inorganic semiconductor device materials, such as amorphous silicon and silicon nitride, are brittle and crack easily when substrates are deformed. Similarly, inorganic materials typically used as conductors may also be brittle and crack relatively easily. In general, most inorganic materials are more brittle and crack more easily that organic materials, at least in the context of materials commonly used to fabricate organic electronic devices. Brittleness may be of particular concern for transparent electrodes, where the material selection is extremely limited due to the need to combine transparency and conductivity in a single material. ITO is a preferred transparent conductive inorganic material, but it has a Young's modulus of 116 GPa and a yield strength of only 1.2 GPa. Some insulative materials that may be desirable in certain types of organic devices such as thin film transistors may have fracture strains as low as 0.05% (MgO, for example). It is believed that most practical applications of embodiments of the invention will involve higher radial or biaxial strains, such as 1.5% and above. To achieve flexible electronics, it is desirable to mitigate the effects of the applied mechanical strain in such device structure on deformable substrates.

Most of the work to date has focused on cylindrical bending deformation of thin foil substrates. In such cases, the semiconductor films on the inside of the deformed surface are in compression and those on the outside are in tension, while there exists a plane between these two with no strain (neutral plane). Assuming the film thickness is negligible and the neutral plane is at the midsurface of the substrate, the magnitude of strain in the surfaces is given by:

$$\varepsilon_{unilateral} = \frac{t}{2p}$$

where t is the substrate thickness and p is the radius of curvature. Since the surface strain can be decreased by reducing the substrate thickness, tight radii of curvature can be achieved simply by using thinner substrates.

However, there are a wide variety of non-cylindrical shapes into which it may be desirable to deform a substrate having devices fabricated thereon. The permanent deformation of thin-film electronics, first fabricated by conventional methods on flat foil substrates, into a spherically shaped cap after the device fabrication process, is desirable. In contrast to rolling, with spherical deformation, the surface is in tension on both the concave and convex sides of the substrate and thinning the substrate cannot be used to reduce the strain, i.e., non-cylindrical deformation generally involves radial or biaxial strain, and substrate thinning does not eliminate radial or biaxial strain. Because inorganic semiconductor and transparent conductor materials are brittle, the uniform layers of device materials may crack during the substrate deformation. Thus, spherical deformation, or any other type of deformation that involves radial or biaxial strain, is fundamentally more difficult than cylindrical deformation because the deformation inherently involves stretching the substrate and devices on it, independent of the substrate thickness. In addition, because radial strain is essentially stretching in all directions, failure may occur at lower stress as compared to biaxial conditions, and the yield stress for uniaxial conditions may be higher than for both radial and biaxial conditions. While many embodiments of the invention are directed to suppressing the cracking of brittle materials subjected to radial or biaxial strain, due to the particular nature of radial and biaxial strain, it is believed that embodiments of the invention may also be applicable to suppressing cracking of devices subjected only to uniaxial strain, but at much higher stress levels than were previously attainable.

Figure 4:
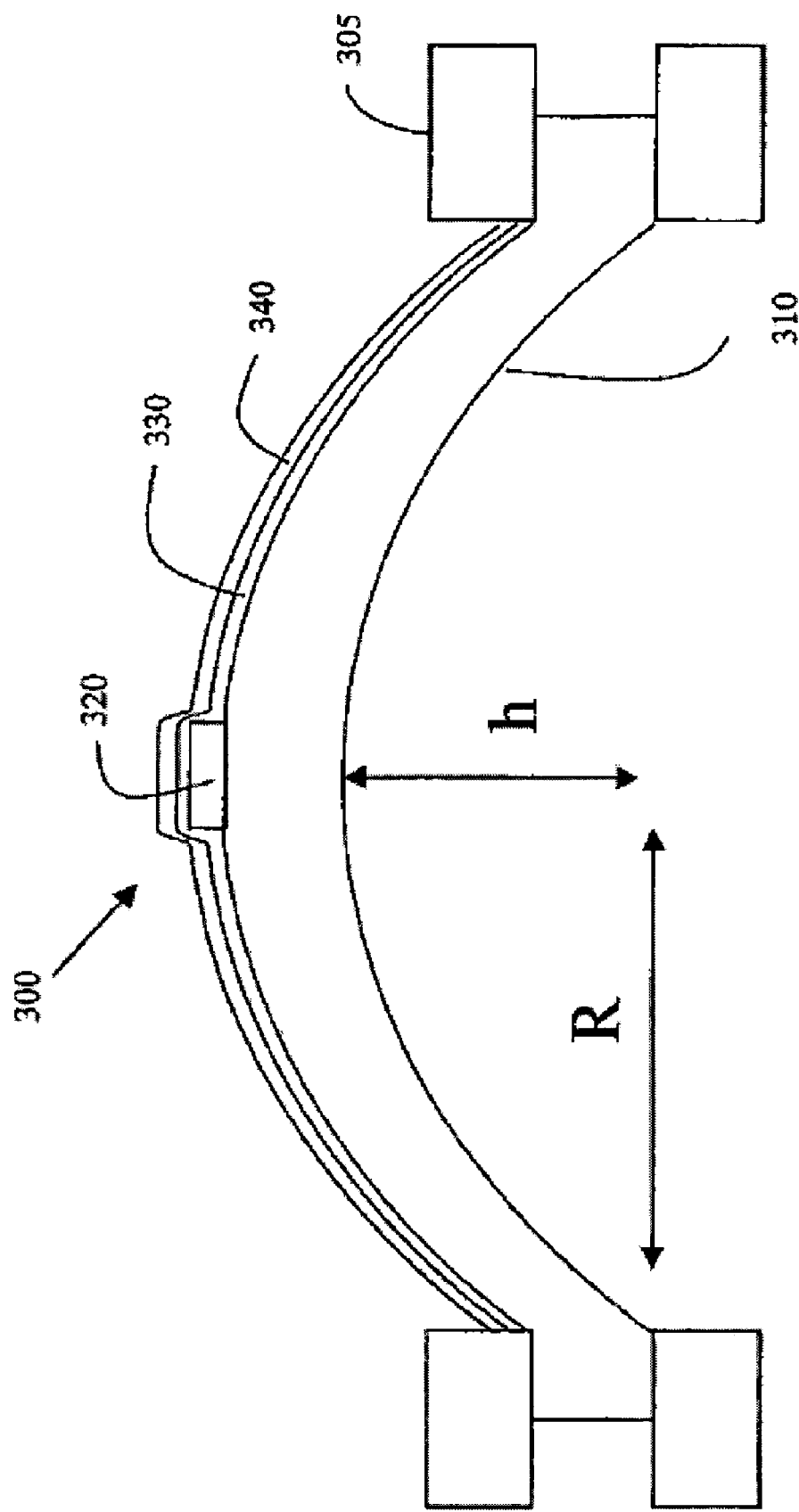
FIG. 4 shows the organic device of FIG. 3, after the substrate has been deformed.

Embodiments of the invention provide a way to prevent brittle inorganic materials from cracking when deformed, even when the deformation involves radial or biaxial strain. For a flat substrate deformed into a sphere, where the initial substrate cross section is compared to the final deformed arc, the average radial strain ($\epsilon_{r,avg}$) necessary to expand the foil to a spherical shape subtending a given angle (θ) is $$\varepsilon_{r,avg} = \frac{\frac{\theta}{2} - \sin\frac{\theta}{2}}{\sin\frac{\theta}{2}} = \frac{\sin^{-1}\left(\frac{2Rh}{R^2+h^2}\right) - \frac{2Rh}{R^2+h^2}}{\frac{2Rh}{R^2+h^2}} \approx \frac{\theta^2}{24} = \frac{2}{3}\left(\frac{Rh}{R^2+h^2}\right)^2.$$

where h is the height of the spherical dome, R is the radius of the clamped substrate. R and h are illustrated in FIG. 4.

In an embodiment of the invention, an organic layer is deposited over a brittle layer, such as a layer of inorganic materials generally used in organic devices. When the device is subsequently deformed, it has been found that the brittle layer is unexpectedly much more resistant to fracture when the organic layer is present. Without intending to be limited by any theory as to how the invention works, it is believed that the organic layer may act to suppress crack formation by providing a compressive stress wherever a crack seeks to nucleate or propagate. This effect is illustrated in FIG. 1. FIG. 1 shows a brittle layer 110 having an organic layer 120 disposed thereon. Organic layer 120 is disposed over brittle layer 110, and is in direct contact with brittle layer 110. The arrows illustrate a shear compressive force applied on brittle layer 110 by organic layer 120, in directions that oppose any strain that brittle layer 110 may experience. Because organic layer 120 is organic, it may be extremely resistant to fracture, perhaps because it plastically deforms more readily than brittle layer 110. The shear compressive force may suppress crack nucleation, as indicated at point 130. Or, the shear compressive force may suppress a crack that has nucleated and is seeking to propagate, as illustrated with respect to crack 140. An alternate non-limiting theory of how the invention may work, that may or may not be cumulative with the theory illustrated in FIG. 1, is that the organic layer may provide extra stiffness to the structure, thereby absorbing some of the stress applied to the brittle layer. These theories of the invention are non-limiting, and embodiments of the invention may work for unrelated reasons.

Figure 2:
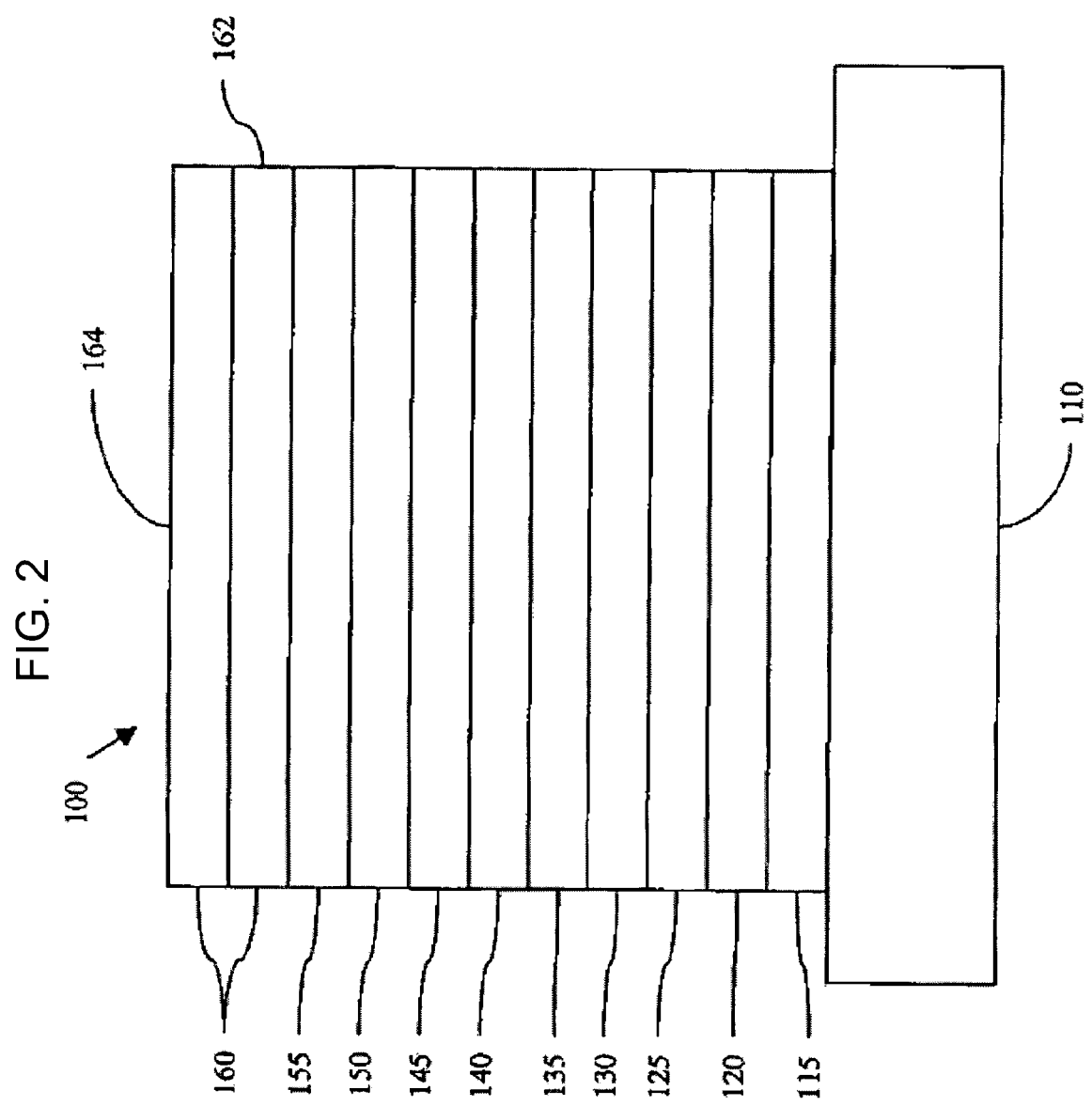
FIG. 2 shows an organic light emitting device having separate electron transport, hole transport, and emissive layers, as well as other layers.

Embodiments of the present invention may involve a wide variety of organic layers that are used in a wide variety of organic devices. The organic "layer" of a particular embodiment may further comprise several organic sublayers. For example, an organic light emitting device (OLED) comprises at least one organic layer disposed between and electrically connected to an anode and a cathode, and many commerical OLEDs have a plurality of organic sublayers. For example, FIG. 2 shows an organic light emitting device 200. The figures are not necessarily drawn to scale. Device 200 may include a substrate 210, an anode 215, a hole injection layer 220, a hole transport layer 225, an electron blocking layer 230, an emissive layer 235, a hole blocking layer 240, an electron transport layer 245, an electron injection layer 250, a protective layer 255, and a cathode 260. Cathode 260 is a compound cathode having a first conductive layer 262 and a second conductive layer 264. Device 200 may be fabricated by depositing the layers described, in order. Typically, layers 220, 225, 230, 235, 240, 245, 250 and 255 each comprise organic materials, and all of these layers collectively may be considered to be an organic layer for purposes of suppressing crack formation and propagation as illustrated in FIG. 1 with respect to organic layer 130. FIG. 1 illustrates a very specific OLED configuration, and it is understood that other configuration having different layers in different orders may be used.

Embodiments of the invention may be used in connection with other improvements designed to aid in the fabrication of flexible and/or deformable organic devices. For example, the smoothness of the brittle layer may be a significant parameter, as described in U.S. Pat. No. 5,844,363, which is incorporated by reference in its entirety.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIG. 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors or memories, may employ the materials and structures.

Figure 3:
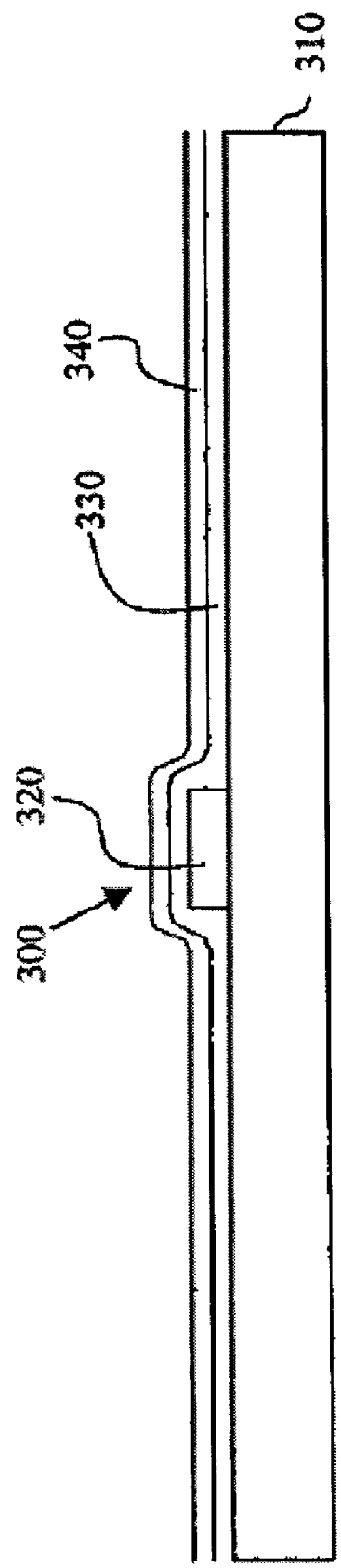
FIG. 3 shows an organic device on a flat substrate.

Because device fabrication may be easier on a flat substrate than on a curved substrate, it may be desirable to fabricate devices on a flat substrate, and then subsequently deform the substrate. FIGS. 3 and 4 illustrate an embodiment that provides an example of such fabrication and subsequent deformation.

In accordance with an embodiment of the invention, devices may be fabricated on one or more islands disposed on a deformable substrate. FIG. 3 illustrates one such device. Device 300 includes a deformable substrate 310, first inorganic layer 320, organic layer 330, and second inorganic layer 340. First inorganic layer comprises a rigid inorganic material, and forms an island on deformable substrate 310. Organic layer 330 is disposed over first inorganic layer 320, and is in direct contact with first inorganic layer 320. Second inorganic layer 340 is disposed over organic layer 330. In the embodiment of FIG. 3, organic layer 330 can suppress crack formation in first inorganic layer 320 when deformable substrate 310 is deformed.

With respect to the "direct contact" between an inorganic brittle layer and an organic layer, it is understood that the inorganic layer may be other than those specifically illustrated in FIGS. 1-3. For example, if there is an inorganic dielectric deposited over the interconnect to prevent shorting, an organic layer deposited over the dielectric may suppress cracking. In addition, an organic layer disposed over a barrier coated substrate may suppress cracking in the barrier.

FIG. 4 shows the device of FIG. 3, after deformable substrate 310 has been deformed. One way to deform substrate 310, which was used to generate the data of the examples, is to provide an annular clamp 305 around substrate 310, and to introduce pressurized gas behind substrate 310 to cause substrate 310 to deform.

Figure 5:
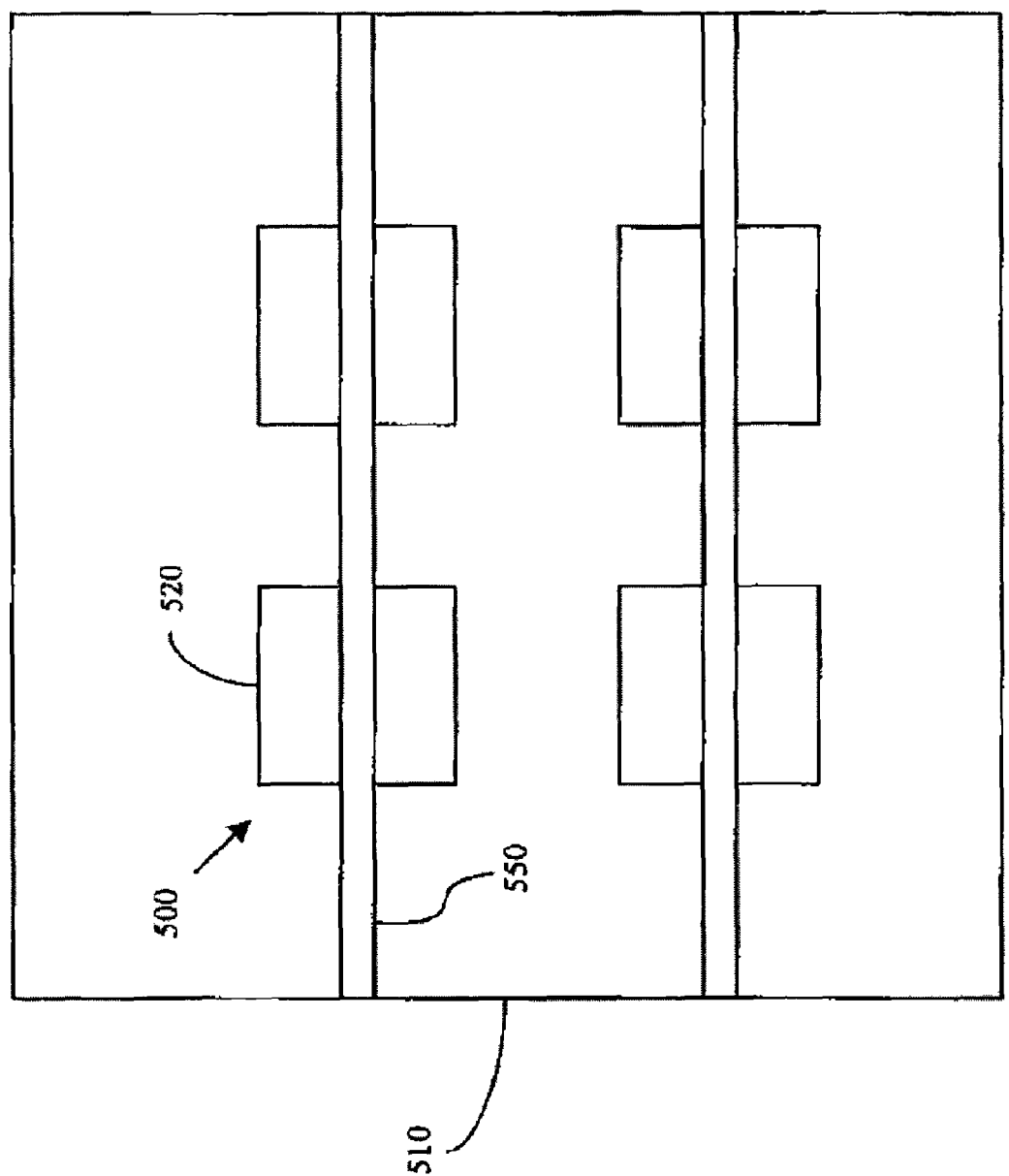
FIG. 5 shows a top view of several devices connected by interconnects.

Although FIGS. 3 and 4 illustrate only a single device 300 in isolation for ease of illustration, it is understood that substrate 310 can accommodate a plurality of devices 300, and that there may be interconnects, as illustrated in FIG. 5. FIG. 5 shows four devices 500. Each device includes deformable substrate 510 and a first inorganic layer 520. Each device also includes an organic layer, and may include a second inorganic layer. These latter layers are not illustrated in FIG. 5 for ease of illustration. Devices 500 may be electrically connected to each other by interconnects 550. One order in which the parts of a device may be deposited is as follows: deposit over deformable substrate 510 a first inorganic layer 520, patterned into islands, then deposit interconnects 550, then deposit an organic layer, and then deposit a second inorganic layer. Hence, an inorganic layer may form an island that is electrically connected to other islands by a conductive interconnect. The organic layer may be disposed over and in direct physical contact with an interconnect. Other layers may also be present. For example, an inorganic dielectric layer may be disposed over the interconnect, and the organic layer disposed over and in direct physical contact with the inorganic dielectric layer.

If devices 500 are OLEDs, for example, first inorganic layer 520 may comprise indium tin oxide (ITO), which acts as a first electrode. The organic layer (see organic layer 320 of FIG. 3) may comprise a stack of organic OLED materials, such as PEDOT, CuPc, NPD, and $Alq_3$, deposited in that order. The second inorganic layer (see second inorganic layer 330 of FIG. 3) may comprise a layer of LiF and a layer of Al, which acts as a second electrode. Interconnects 550 and a top blanket electrode (inorganic layer 330) may be used to apply a voltage across the devices. Using various interconnect configurations, and possibly transistors (which may be organic transistors fabricated in accordance with embodiments of the invention), various active and passive matrix designs may be used to control which devices emit light. Other types of organic devices may also be fabricated, such as photosensitive optoelectronic devices, or organic transistors.

FIGS. 3-5 illustrate devices that include a first inorganic layer 320 (or 520) that is shaped into islands. Such islands may be a preferred embodiment, because islands allow any strain that occurs in deformable substrate 310 (or 510) to concentrate in the interstices between the islands, such that the deformable substrate 310 is effectively "pinned" beneath the islands, and deforms much less in the regions beneath the islands than in the interstices. On a stiff substrate, there may be significant interactions between the strain concentrations generated by neighboring islands for fill factors that are greater than 50%, so a fill factor not greater than 50% is preferred. The "fill factor" is the percentage of the area of the substrate that is covered by islands. For the geometry of FIG. 5, with square islands having sides with a length $R_1$ and a center to center island separation $R_2$, the fill factor is $(R_1/R_2)^2$. The term "nominal strain" as used herein refers to the amount of strain that would occur at the surface of a substrate where it contacts a first inorganic layer, if there were no inorganic layer present—i.e., the term "nominal strain" assumes that there is no pinning beneath the first inorganic layer, and no strain concentration in any interstices that may exist between islands of the first inorganic layer. Island structures with inorganic devices on deformable substrates are described in the literature, such as Hsu et. al, "Amorphous Si TFTs on plastically deformed spherical domes," J. Non-Crystalline Solids 299-302 (2002). Such literature does not predict the unexpectedly good device yields and reduced susceptibility to fracture of brittle materials obtained with organic devices as opposed to inorganic devices.

It has been shown that there are significant improvements in device yields due to the presence of an organic layer, where the devices included ITO islands that were 200 nm thick, and the islands had a largest dimension of 113 microns, 141 microns, and 169 microns. It is expected that island dimension at which the presence of an organic material has a significant effect will vary with the thickness of the brittle inorganic layer, because thinner inorganic layers may be more fragile, and thus susceptible to fracture at smaller largest dimensions. The fill factor and island size at which cracking becomes an issue depends on a number of factors, including the properties of the substrate and the thickness of the islands. For example, depending upon these factors, cracking may become an issue at island sizes ranging from 1 micron to 1 mm, or even at sizes outside of this range.

Significant increases in device yield were observed where a brittle inorganic layer was covered by an organic layer that was 110 nm thick. It is expected that thicker layers would lead to even better yields. Significant decreases in interconnect cracking were observed for interconnects covered by organic layers that were 160 nm thick. Due to differences in the structure of interconnects as compared to other devices (interconnects tend to be elongated), it is believed that thicker organic layers may be needed to suppress cracking.

Although islands may be a preferred embodiment, it is expected that an organic layer disposed over an inorganic layer will suppress crack formation even in the absence of islands in the inorganic layer. A structure that does not include islands may be commercially desirable for situations where a large fill factor may be desirable, such as lighting applications involving deformable substrates.

In addition, it is expected that an organic layer disposed over an inorganic layer will suppress cracking in the inorganic layer, whether or not the inorganic layer is an electrode. For example, it was observed that interconnects covered with organic material did not crack upon deformation of the substrate, while similar interconnect that were not covered with organic material did crack upon similar deformation of the substrate.

In a preferred embodiment of the invention, the deformation of a substrate occurs above the glass transition temperature of the substrate. It is believed that deformation above the glass transition temperature allows for easier deformation of the substrate, which may to some degree relieve stress on any overlying brittle layers.

In a preferred embodiment of the invention, the substrate is deformed slowly. For example, a strain rate of 1.5% over 50 minutes may be considered slow. It is believed that slow deformation allows the substrate time to plastically deform, which may to some degree relieve stress on any overlying brittle layers.

Other layers may be present in devices according to the invention. For example, the organic layer may comprise a photoactive organic layer, a small molecule organic layer, and/or a polymeric organic layer. Similarly, a variety of substrate materials may be used, such as metal foils and polymers. The substrate may be conductive or semiconductive. Use of different layers and substrates may allow the devices to be used for a variety of applications. The devices may be solar cells, photodetecetors, transistors, memory, and interconnects. Such devices may have other uses.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting.

Figure 6B:
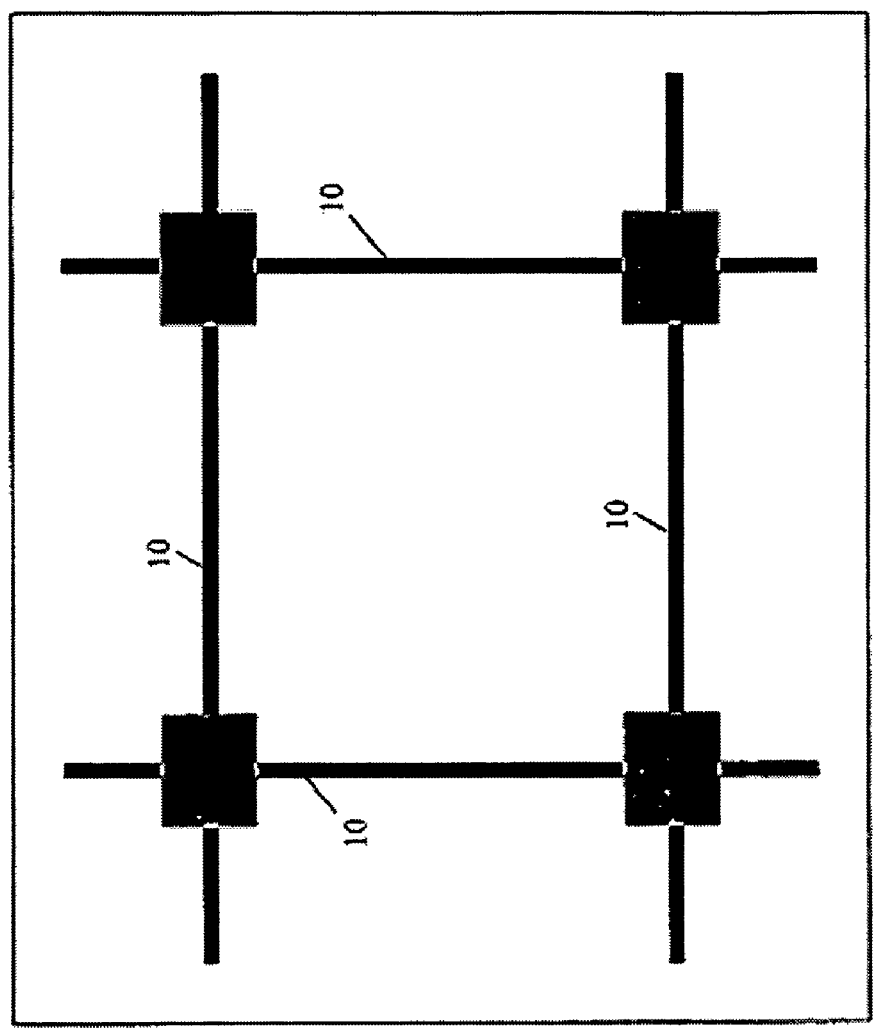
FIG. 6B is a top view of an array of electronic devices connected with stretchable interconnects having a flat profile.

FIGS. 6A-6B are schematic diagrams of stretchable interconnect 10 for electrically connecting electronic components 12. Stretchable interconnect 10 can have a substantially buckled or wavy profile, as shown in FIG. 6A. The wavy profile is across the thickness of stretchable interconnect, for example in and out of the surface. Alternatively, stretchable interconnect 10 can have a substantially flat profile, as shown in FIG. 6B. Electronic component 12 can comprise electronic devices, thin film devices, sensors, circuit elements, control elements, microprocessors, transducers or any other desired electronic device as well as combinations of the foregoing. Stretchable interconnects 10 can be connected to respective contact pads 13 of two adjacent electronic components 12 for electrically coupling a contact of one device to a contact of another device. Electrical contact between stretchable interconnect 10 and device pad 13 of electronic component 12 can be achieved using any one of the techniques used in the fabrication and packaging of integrated circuits and printed wiring boards, such as metal evaporation, wire bonding, application of solids or conductive pastes. Stretchable interconnect 10 comprises a conductive film or conductive stripe formed on or embedded within a flexible substrate, as described below.

Figure 7A:
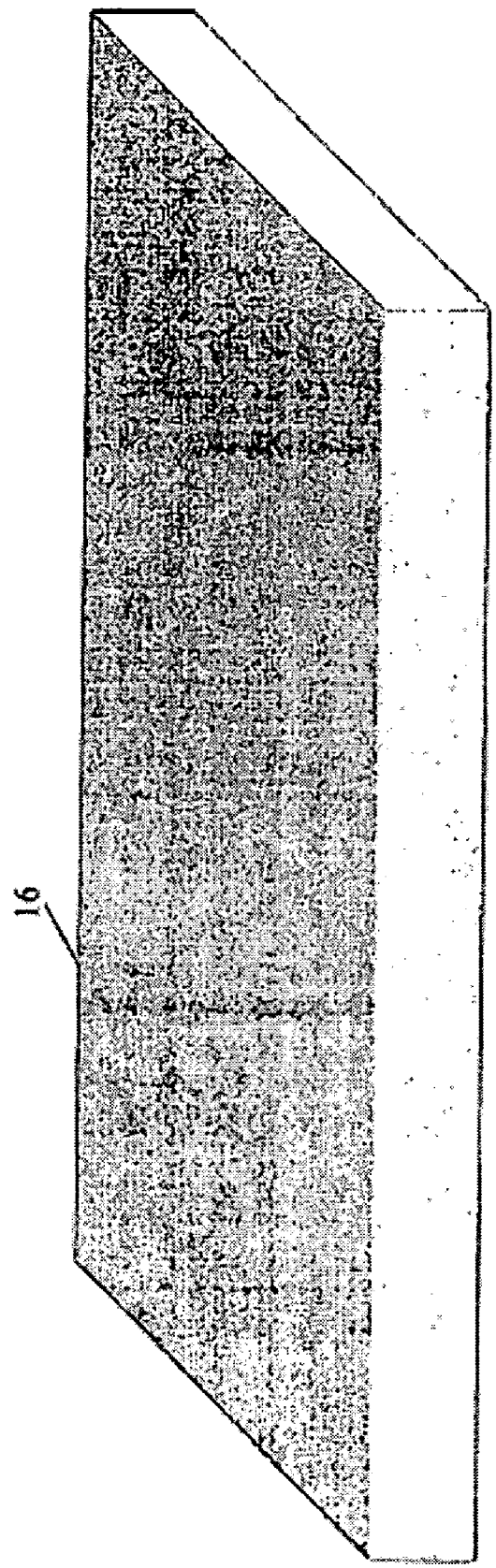
FIG. 7A is a perspective schematic diagram of a substrate prior to application of a conductive film.
Figure 7B:
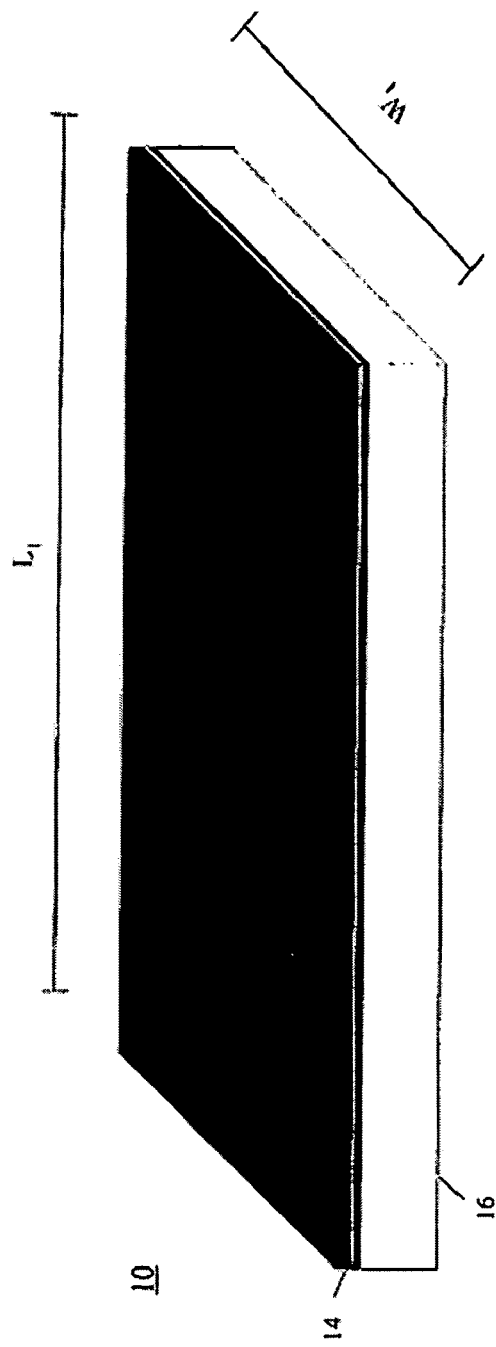
FIG. 7B is a perspective schematic diagram of a stretchable interconnect formed by application of a conductive film to the substrate shown in FIG. 7A.
Figure 7C:
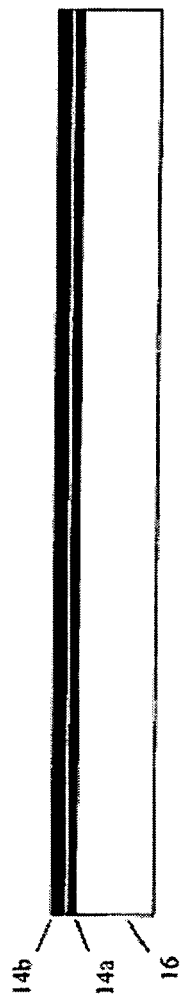
FIG. 7C is a side elevational view of the stretchable interconnect shown in FIG. 7B.

Stretchable interconnect 10 may be formed by covering flexible substrate 16 with conductive film 14, as shown in FIGS. 7A-7C. Substrate 16 can be an organic or inorganic material that can be stretched reversibly or stretched non-reversibly. A material which can be stretched non-reversibly can be deformed only once. Materials that can be stretched reversibly in order to be stretched and relaxed repeatedly are elastomeric, rubber-like. Elastomeric materials include carbon-based or silicon-based polymeric rubbers. Suitable elastomeric materials are silicone rubber, such as polydimethyl siloxane (PDMS) and acrylic rubber. Materials that can be deformed once include plastic materials. Suitable plastic materials include polyethylene terephthalate. Alternatively, substrate 16 can be formed of polymeric materials which are partly elastic and partly plastic. A suitable polymeric material is polyimide. The characteristic of the elastomeric or plastic material can depend strongly on temperature. Geometry of substrate 16 can be determined for a desired use. For example, substrate 16 can have a thickness of less than about 1 μm to about 1 cm and an area in the range of about 1 μm$^2$ to about 1 m$^2$ or more.

Conductive film 14 can comprise one or more layers of materials. Electrically conductive materials useful for conductive film 14 include metallic conducting materials such as copper, silver, gold, aluminum and the like. Alternatively, electrically conductive materials include organic conducting materials such as polyaniline. Suitable electrically conductive materials include a semiconductor, either inorganic like silicon or indium tin oxide, or organic-like pentacene or polythiophene. Alternatively, the electrically conductive materials can be alloys instead of stoichiometric elements or compounds. Conductive film 14 can be formed on substrate 16 by electron beam evaporation, thermal evaporation, sputter deposition, chemical vapor deposition (CVD), electroplating, molecular beam epitaxy (MBE) or any other conventional means. Conductive film 14 can be very thin of a mono or few atomic layers.

An electrically conductive material having adhesive properties to the substrate material may be used singly or in combination with one or more additional layers, for example, a first conductive film 14$a$ of chromium can be applied to substrate 16 as an adhesive layer and a second conductive film 14$b$ of gold can be applied to the chromium layer. First conductive film 14$a$ applied to substrate 16 as an adhesive layer can be a thin film having a thickness in the range of about 1 nm to about 100 nm, as shown in FIG. 7C. Second conductive film 14$b$ applied to first conductive film 14$a$ can be a thin film having a thickness in a range of about 1 nm to about 1000 nm.

In such configurations, stretchable interconnect 10 retains a flat profile after application of conductive film 14 to substrate 16. Stretchable interconnect 10 can be stretched along its length $L_1$ and/or its width $W_1$ and retain electrical conduction in both the length or width directions.

Figure 8A:
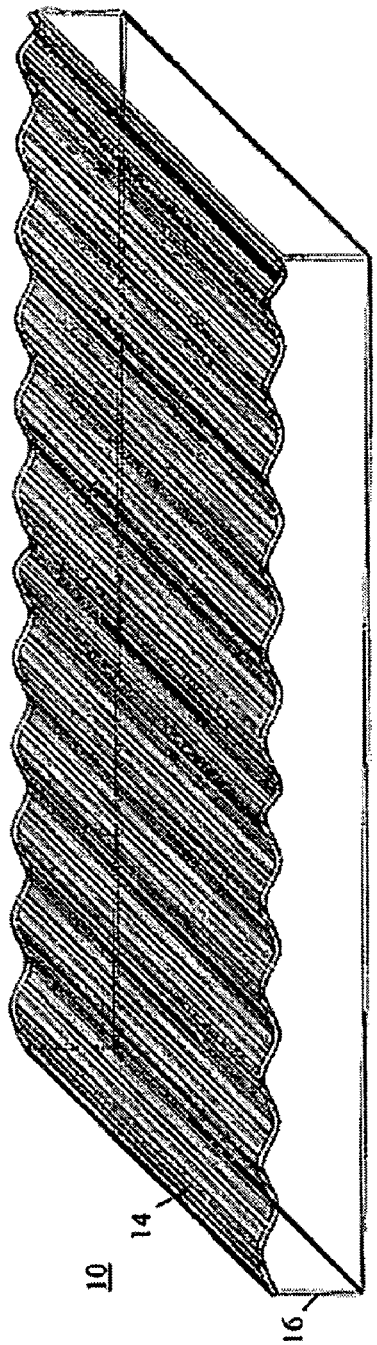
FIG. 8A is a perspective schematic view of a stretchable interconnect having a buckled or wavy profile.
Figure 8B:
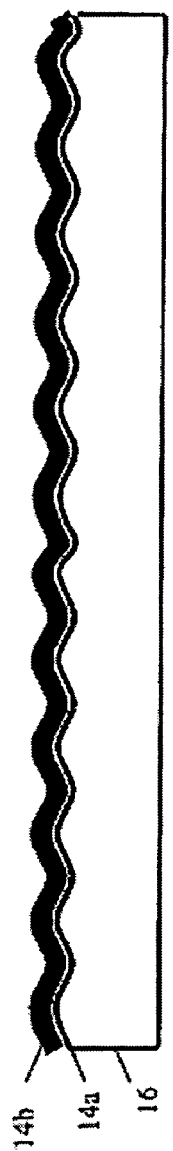
FIG. 8B is a side elevational view of the stretchable interconnect shown in FIG. 8A.

In other configurations, stretchable interconnect 10, formed by the above described method, has a wavy or buckled profile, as shown in FIGS. 8A-8B. For example, the profile can be buckled randomly or organized in waves with long-range periodicity. The wavy or buckled profile can be induced by compressive stress within conductive film 14 upon application of the film to substrate 16. The compressive stress can be a result of built in stress or thermal expansion mismatch or both.

Figure 9:
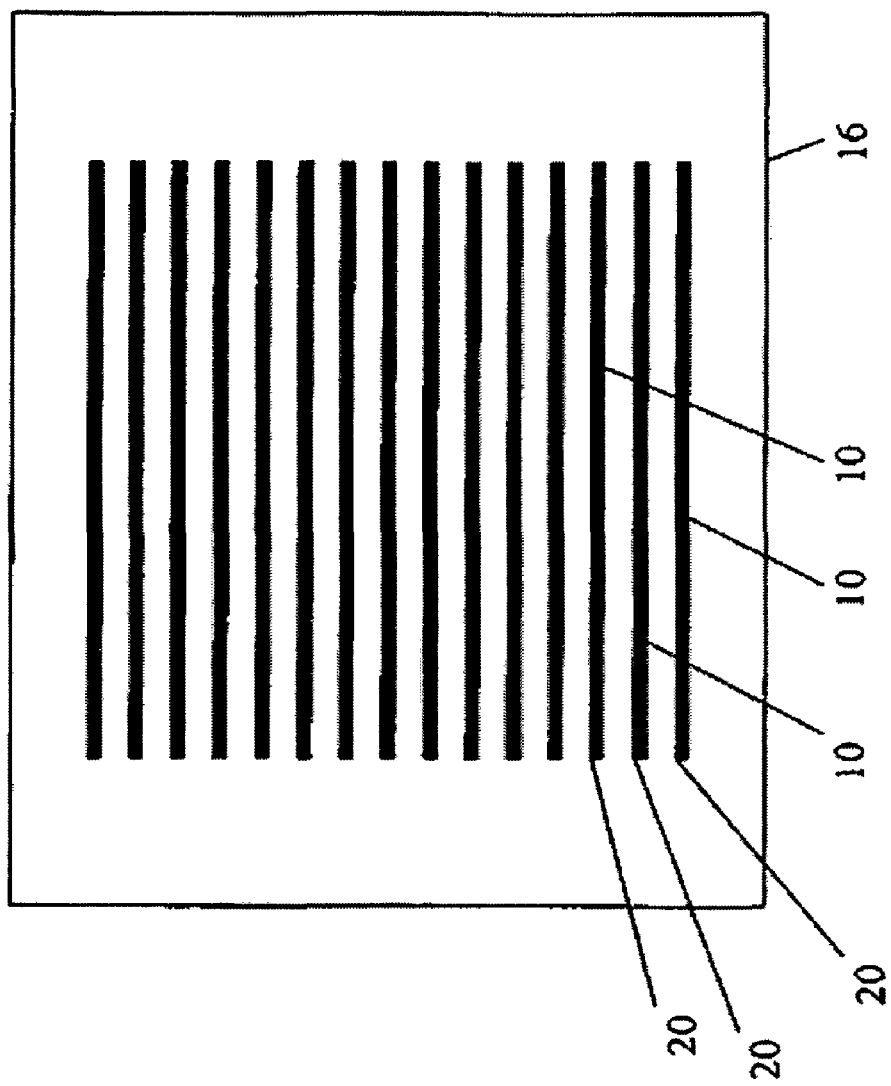
FIG. 9 is a top plan view of a plurality of stretchable interconnects formed as conductive stripes.

Stretchable interconnect 10 can be formed as conductive stripe 20 on substrate 16, as shown in FIG. 9. Conductive stripe 20 can have a width in the range of about 100 μm to about 2 nm or, alternatively, about 1 nm to about 1 m and a length determined by the desired application. For example, spacing between conductive stripes 20 can be the same as (the distance between stretchable interconnects) the width of the stretchable interconnects, shown in FIG. 6A. A conductive stripe can be formed in various patterns on the substrate. Conductive stripe 20 can be configured in conformance with overall interconnect geometry of a desired application.

Figure 10A:
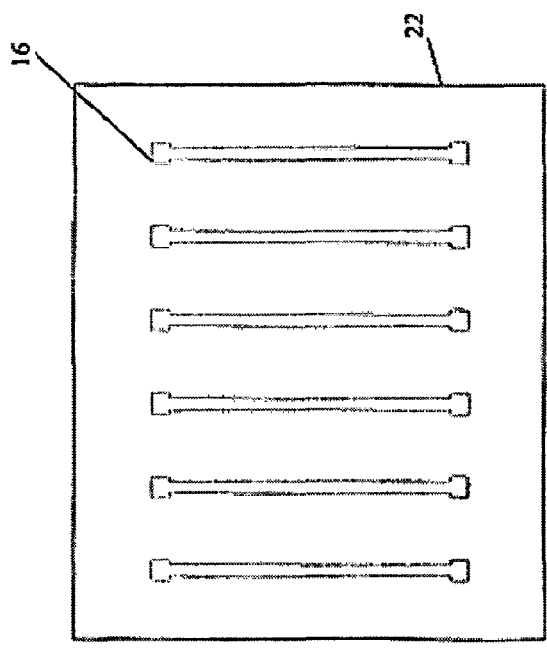
FIG. 10A is a top plan view of a compliant shadow mask used for forming conductive stripes.
Figure 10B:
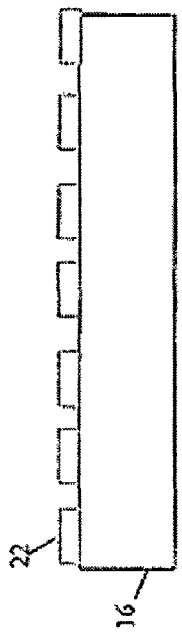
FIG. 10B is a cross-sectional view of the shadow mask shown in FIG. 10A.
Figure 12A:
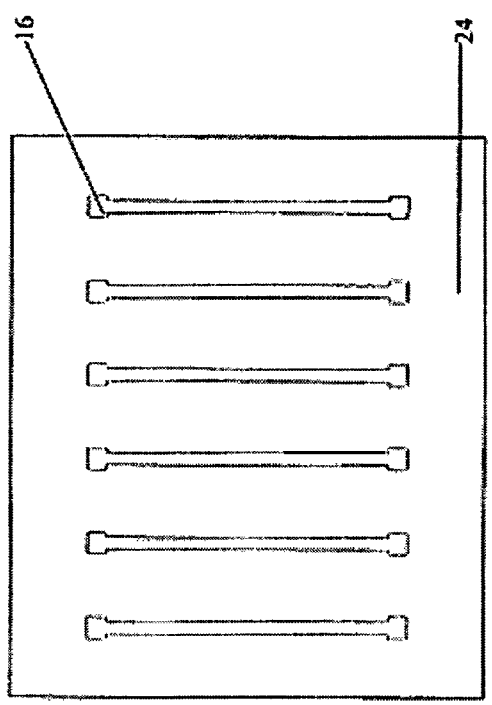
FIG. 12A is a top plan view of a photoresist mask used for forming conductive stripes.
Figure 12B:
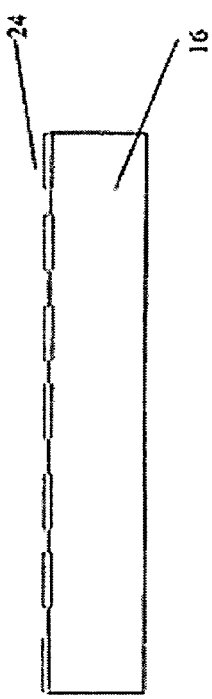
FIG. 12B is a cross-sectional view of the photoresist mask shown in FIG. 12A.

Conductive stripe 20 is formed of a similar material as conductive film 14. Conductive stripe 20 can be formed by evaporating conductive film 14 through shadow mask 22, as shown in FIGS. 10A-10B. Shadow mask 22 can be formed of a compliant material, such as polyimide, a metal foil, for example, of bronze. Alternatively, photolithography and lift-off patterning can be used to form stripes 20, as shown in FIGS. 12A-12B. Photolithography with a positive photoresist mask 24 is used to pattern stripe 20 after metal evaporation. The thickness of photoresist mask 24 can be less, comparable or larger than the thickness of conductive stripe 20. Suitable positive photoresists are AZ5216 and Riston™ (Dupont). After development of the photoresist, metal regions no longer covered by the photoresist are removed by wet or dry etching. For example, stripes 20 can have a width the same or less than about 1 mm. Alternatively, lift-off patterning is performed prior to evaporation using negative photoresist. Stripes 20 are released by chemical stripping of the resist mask after the metal evaporation. Shadow mask 22 can have a thickness in the range of about 50 μm to about 1 mm which is one to six orders of magnitude thicker than the deposited conductor stripe. Shadow mask 22 is applied to substrate 16 prior to evaporation of conductive film 14 and is removed after evaporation of conductive film 14.

Figure 11A:
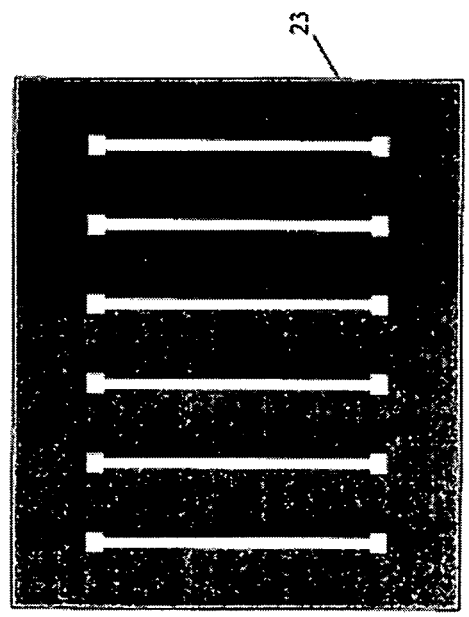
FIG. 11A is a top plan view of a rigid shadow mask used for forming conductive stripes.
Figure 11B:
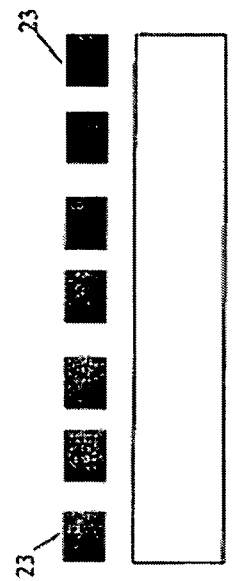
FIG. 11B is a cross-sectional view of the shadow mask shown in FIG. 11A.

Alternatively, shadow mask 22 can be formed of a rigid material, as shown in FIGS. 11A-11B. Suitable rigid material includes thick metal such as aluminum or bronze. Shadow mask 22 can have a thickness in the range of about 25 μm to about 5 mm which is one to six orders of magnitude thicker than a thickness of stripe 20 providing a smaller resolution of a width of stripe 20. Shadow mask 23 is mounted on top or apart from substrate 16 prior to evaporation of conductive film 14 and is released or removed after evaporation of conductive film 14.

Figure 13:
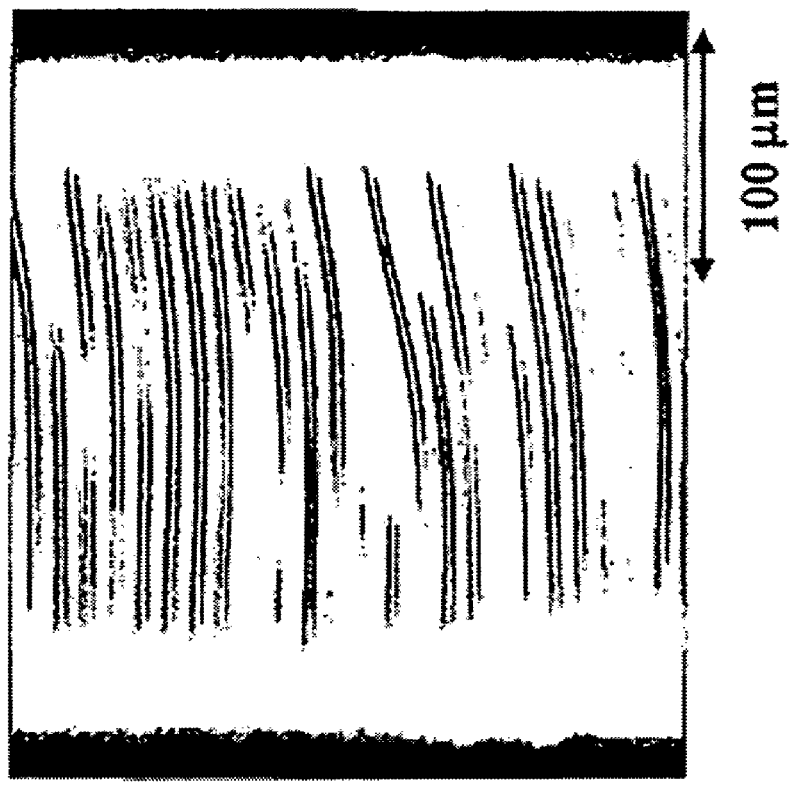
FIG. 13 is an optical image of a conductive stripe including a built-in wavy profile.

In some configurations, stripes 20 can have a wavy or buckled profile formed as compressed stripes. For example, FIG. 13 illustrates surface waves formed on a 0.25 mm wide stripe.

Figure 14A:
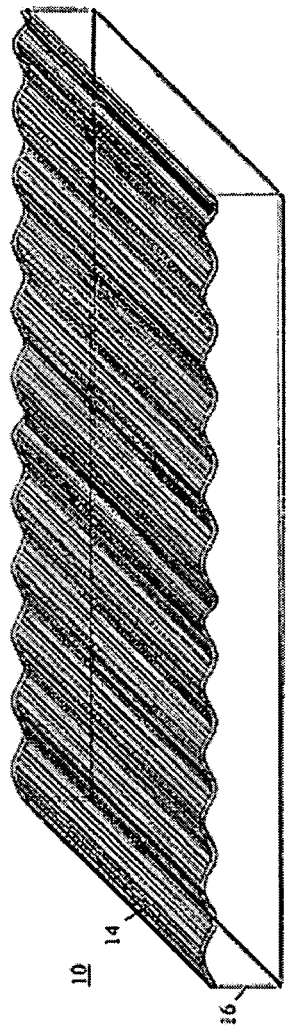
FIG. 14A is a perspective schematic view of a wavy interconnect substrate.
Figure 14B:
FIG. 14B is a side elevational view of the substrate of FIG. 14A.
Figure 14C:
FIG. 14C is a side elevational view of a stretchable interconnect formed on the substrate of FIG. 14A.

Stretchable interconnect 10 may be formed on substrate 16 which has been prepatterned, as shown in FIG. 14A-14C. Substrate 16 is prepatterned to form a plurality of waves 40 in top surface 42 of substrate 16. Conductive film 14 is applied to prepatterned substrate 16 with methods as described above.

Figure 15A:
FIG. 15A is a side elevational view of a substrate used in forming a stretchable interconnect.
Figure 15B:
FIG. 15B is a side elevational view of the substrate after pre-stretching of the substrate by X % strain.
Figure 15C:
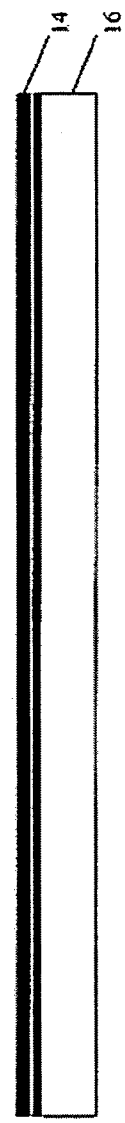
FIG. 15C is a side elevational view of a stretchable interconnect formed after application of a conductive film to the pre-stretched substrate.
Figure 15D:
FIG. 15D is a side elevational view of the wavy stretchable interconnect in a relaxed condition.

Stretchable interconnect 10 may also be formed by pre-stretching substrate 16 before application of conductive film 14, as shown in FIGS. 15A-15D. Substrate 16 is formed in FIG. 15A. Substrate 16 can be formed of a reversibly stretchable material, such as an elastomer. Substrate 16 is pre-stretched prior to evaporation by a predetermined pre-stretch percentage represented by X %, as shown in FIG. 15B. The pre-stretched percentage X % can be in the range of about 0.5% to about 500%, about 0.5% to about 50%, about 0.5% to about 100%. Conductive film 14 is applied to pre-stretched substrate 16 with techniques described above, as shown in FIG. 15C. After deposition of conductive film 14, substrate 16 is relaxed as shown in FIG. 15D. Stretchable interconnect 10 formed by this method has a wavy or buckled profile.

Figure 16A:
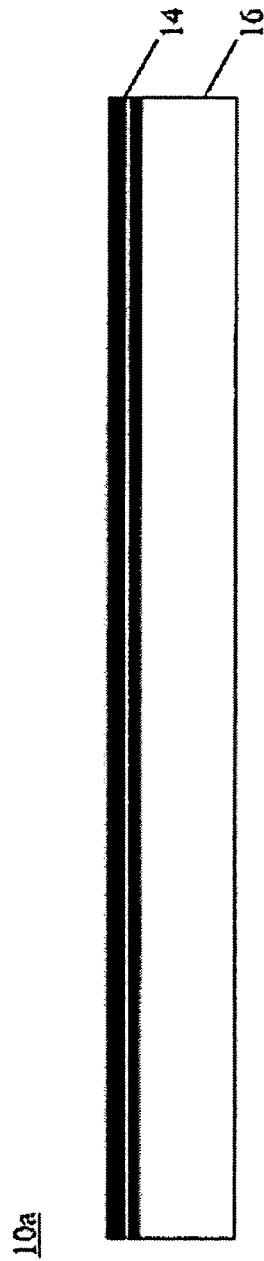
FIG. 16A is a side elevational view of a stretchable interconnect formed in accordance with FIGS. 7A-7B.
Figure 16B:
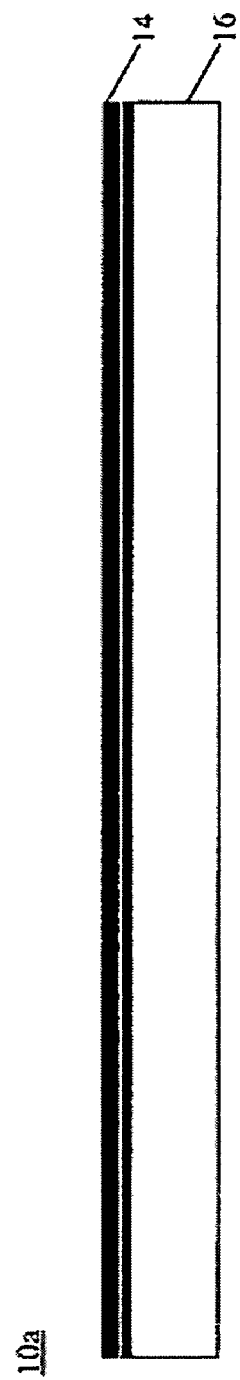
FIG. 16B is a side elevational view of the stretchable interconnect of FIG. 16A while stretching.

Stretchable interconnect 10 can be stretched as shown in FIGS. 16-18. In FIG. 16A, stretchable interconnect 10 is formed by the method of FIGS. 7A-7B. It has been found that stretchable interconnect 10a can be stretched by up to at least 500%, 100%, 50% and retain electrical conduction, as shown in FIG. 16B. It has been found that stretchable interconnect 10a retains electrical conduction upon formation of microcracks in a surface conductive film 14 upon stretching. It is believed that a thin layer of the conductive material remains at the interface of the conductor material and substrate to provide a continuous layer even if the surface of the film is discontinuous.

Figure 17A:
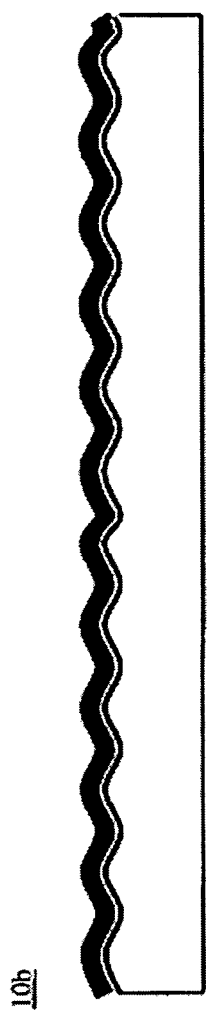
FIG. 17A is a side elevational view of a stretchable interconnect formed in accordance with FIGS. 8A-8B.
Figure 17B:
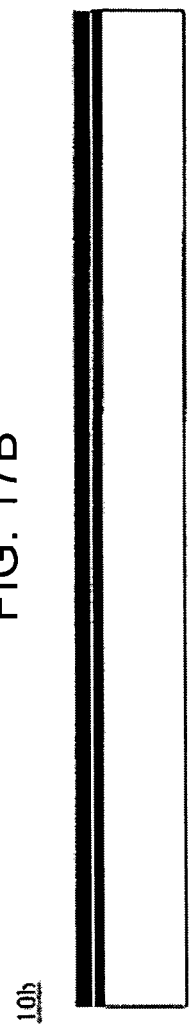
FIG. 17B is a side elevational view of the stretchable interconnect of FIG. 17A when stretched flat.
Figure 17C:
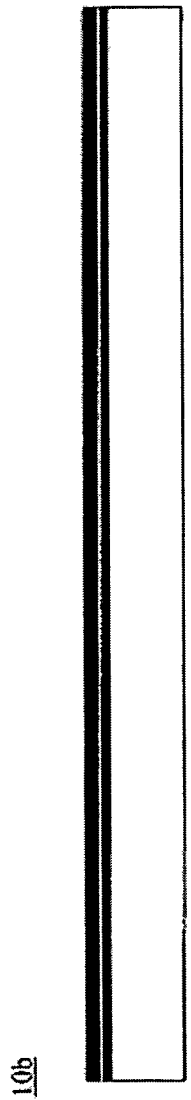
FIG. 17C is a side elevational view of the stretchable interconnect of FIG. 17B upon additional stretching.

In FIG. 17A, stretchable interconnect 10 is formed by the method of FIGS. 8A-8B. Stretchable interconnect 10b can be stretched flat by stretching substrate 16 up to about 0.5%, as shown in FIG. 17B. Thereafter, stretchable interconnect 10b can be stretched up to an additional about 500%, 100%, 50% and retain electrical conductivity, as shown in FIG. 17C.

Figure 18A:
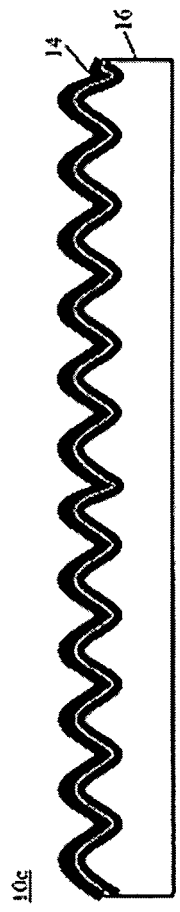
FIG. 18A is a side elevational view of a stretchable interconnect formed in accordance with FIGS. 15A-15D.
Figure 18B:
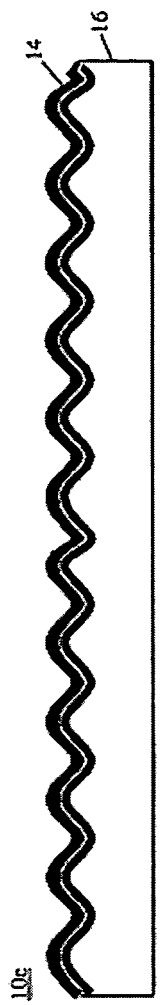
FIG. 18B is a side elevational view of the stretchable interconnect of FIG. 18A when stretched less than the initial pre-stretching (X %) percentage.
Figure 18C:
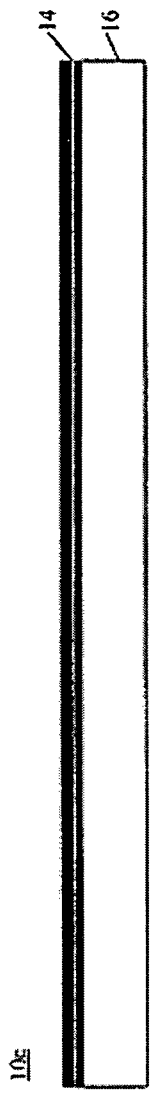
FIG. 18C is a side view of the stretchable interconnect of FIG. 18A when stretched flat at a value equal to the initial pre-stretched percentage.
Figure 18D:
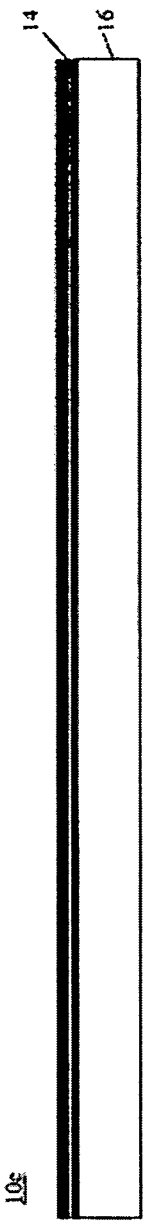
FIG. 18D is a side view of the stretchable interconnect of FIG. 18A when stretched to a greater value than the initial pre-stretched percentage.

In FIG. 18A, stretchable interconnect 10c is formed by the method of FIGS. 15A-15D. Stretchable interconnect 10c can be stretched less than the value of the prestretched percentage of X %, as shown in FIG. 18B. Thereafter, substrate 16 can be stretched to about the value of the pre-stretched percentage of X % to be stretched flat, as shown in FIG. 18C. Stretchable interconnect 10c can be further stretched a value several times greater than the pre-stretched percentage of X % and retain electrical conduction, as shown in FIG. 18D. For example, stretchable interconnect 10c can be stretched to a percentage from about 5 to about 50%, to about 100%, to about 500% and retain electrical conduction.

Stretchable interconnect 10 may be formed as films or stripes which can be embedded within substrate 16, as shown in FIGS. 19A-19B. Films or stripes embedded within substrate 16 can have a flat or wavy profile. Openings 40 can be formed in substrate 16. Electrical contacts to electronic devices can access stretchable interconnect 10 through opening 40.

Figure 20A:
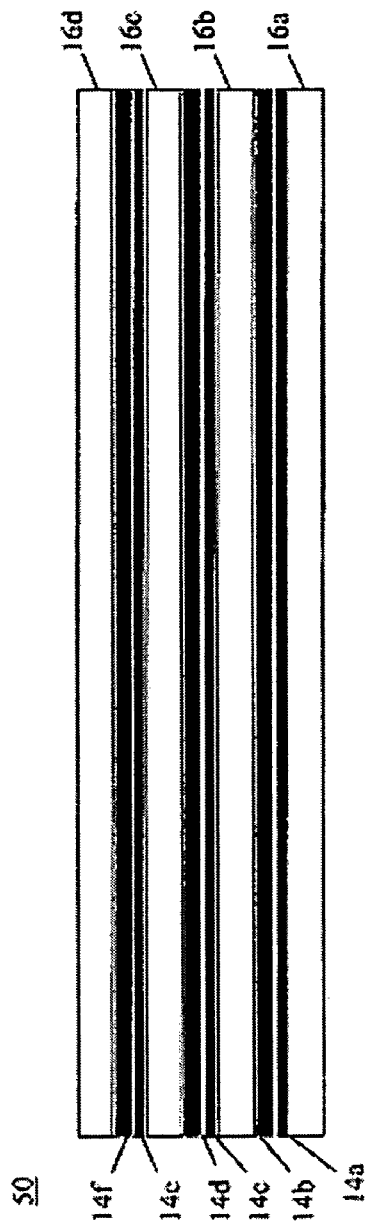
FIG. 20A is a side elevational view of a stack of stretchable interconnects where each layer has a flat profile.

A plurality of layers of conductive film 14 or stripe 20 may be embedded between a plurality of layers of substrate 16. In one embodiment shown in FIG. 20A, stack of stretchable interconnects 50 is formed by embedding a plurality of layers of conductive film 14a-f within a plurality of layers of substrate 16a-16d, using a similar method as described for FIGS. 7A-7C. Conductive film 14a is applied to substrate 16a. Conductive film 14b is applied to conductive film 14a. Substrate 16b is applied to conductive film 14b. Conductive film 14c is applied to substrate 16b. Conductive film 14d is applied to conductive film 14c. Substrate 16c is applied to conductive film 14e. Substrate 16c is applied to conductive film 14d. Conductive film 14e is applied to substrate 16c. Conductive film 14f is applied to conductive film 14e. Substrate 16d is applied to conductive film 14f.

Figure 20B:
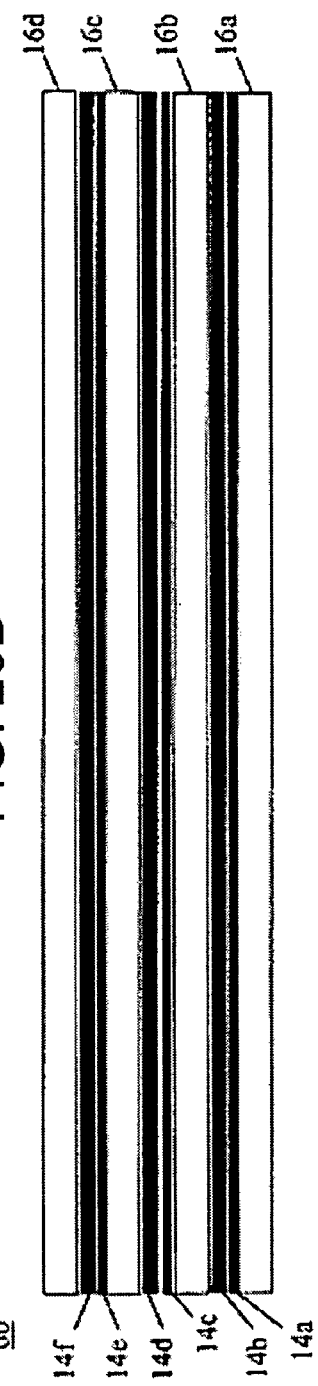
FIG. 20B is a side elevational view of the stack of stretchable interconnects of FIG. 20A when stretching.

Stack of stretchable interconnects 50 can be stretched as shown in FIG. 20B. Each of substrates 16a-16d and conductive films 14a-14f are stretched uniformly to provide a uniformly stretched stack of films.

Figure 21A:
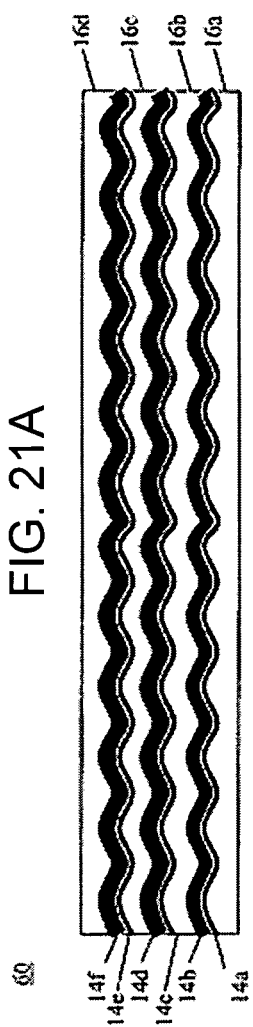
FIG. 21A is a side elevational view of a stack of stretchable interconnects with each layer having a wavy profile.
Figure 21B:
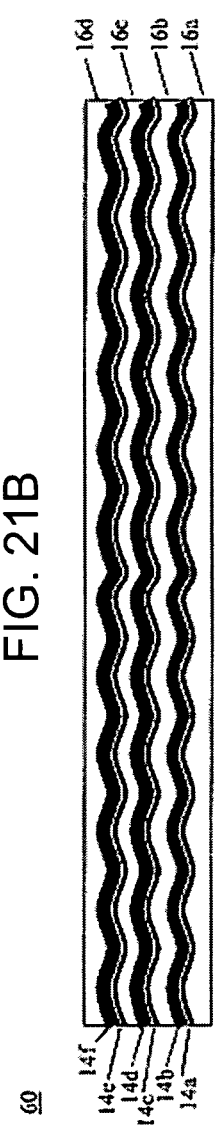
FIG. 21B is a side elevational view of the stack of stretchable interconnects of 16A when stretching at a lower value than the pre-stretched percentage X %.
Figure 21C:
FIG. 21C is a side elevational view of the stack of stretchable interconnects of 21B when stretched to a value greater than the initial pre-stretched percentage X %.

In an alternate embodiment, a plurality of layers of conductive film are embedded between a plurality of layers of substrate 16, as shown in FIGS. 21A-21C. Stack of stretchable interconnects 60 is formed by embedding a plurality of layers of conductive film 14a-14f within a plurality of layers of substrate 16a-16d using similar methods as described for FIGS. 8A-8B and FIGS. 15A-15D. In one aspect, layers of substrate 16a-16d can be pre-stretched to a pre-stretched percentage of X %. Conductive film 14a is applied to substrate 16a. Conductive film 14b is applied to conductive film 14a. Substrate 16b and 16c are applied to respective conductive film 14b and 14d. Conductive films 14c and 14e are applied to respective substrates 16b and 16c. Conductive films 14d and 14f are applied to respective conductive films 14c and 14e. Substrate 16d is applied to conductive film 14f. Stack of stretchable interconnects 60 has a wavy or buckled profile.

A stack of thin films 60 may be formed by embedding a plurality of layers stripes 20a-20f within a plurality of layers of substrate 16a-16d. Buckling or waves of stripes 20 can be induced by built-in compressive stress.

Stack of stretchable interconnects 60 can be stretched to a value below the prestretched percentage X %, as shown in FIG. 21B. Stack of stretchable interconnects 60 can be stretched to a value greater than the pre-stretched percentage X % and each of substrates 16*a*-16*d* and conductive films 14*a*-14*f* are stretched uniformly to provide a uniformly stretched stack of films.

Figure 22:
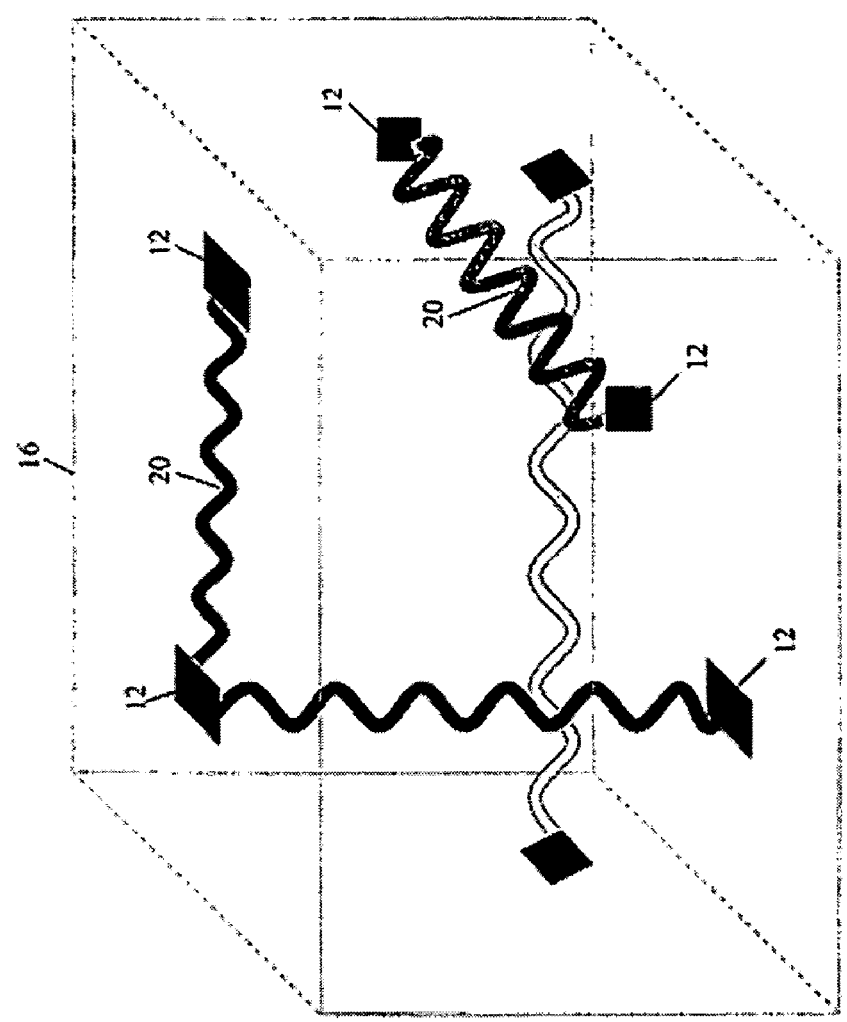
FIG. 22 is a schematic view of stretchable interconnects mounted in a substrate.

In various embodiments, stretchable interconnects 10 formed as conductive stripes 20 can be formed in different directions on substrate 16, as shown for example in FIGS. 6A-6B. Alternatively, stretchable interconnects 10 formed as conductive stripes 20 can be embedded within substrate 16 as a single layer or in a plurality of layers. In other embodiments, stretchable interconnects can be formed of conductive films 14 or conductive stripes 20 and can be oriented in X, Y and Z directions on substrate 16 or embedded within substrate 16, as shown in FIG. 22.

The invention can be further illustrated by the following examples thereof, although it will be understood that these examples are included merely for purposes of illustration and are not intended to limit the scope of the invention unless otherwise specifically indicated. All percentages, ratios, and parts herein, in the Specification, Examples, and Claims, are by weight and are approximations unless otherwise stated.

Material Definitions:

As used herein, abbreviations refer to materials as follows. With the exception of ITO, the following materials are non-limiting examples of organic materials that may be useful for embodiments of the present invention.

| | |
|---|---|
| CBP: | 4,4'-N,N-dicarbazole-biphenyl |
| m-MTDATA | 4,4',4''-tris(3-methylphenylphenlyamino)triphenylamine |
| $Alq_3$: | 8-tris-hydroxyquinoline aluminum |
| Bphen: | 4,7-diphenyl-1,10-phenanthroline |
| n-BPhen: | n-doped BPhen (doped with lithium) |
| $F_4$-TCNQ: | tetrafluoro-tetracyano-quinodimethane |
| p-MTDATA: | p-doped m-MTDATA (doped with $F_4$-TCNQ) |
| $Ir(ppy)_3$: | tris(2-phenylpyridine)-iridium |
| $Ir(ppz)_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine. |
| ITO: | indium tin oxide |
| NPD: | N,N'-diphenyl-N-N'-di(1-naphthyl)-benzidine |
| TPD: | N,N'-diphenyl-N-N'-di(3-toly)-benzidine |
| BAlq: | aluminum(III)bis(2-methyl-8-hydroxyquinolinato)4-phenylphenolate |
| mCP: | 1,3-N,N-dicarbazole-benzene |
| DCM: | 4-(dicyanoethylene)-6-(4-dimethylaminostyryl-2-methyl)-4H-pyran |
| DMQA: | N,N'-dimethylquinacridone |
| PEDOT:PSS: | an aqueous dispersion of poly(3,4-ethylenedioxythiophene) with polystyrenesulfonate (PSS) |

Experimental:

Specific representative embodiments of the invention will now be described, including how such embodiments may be made. It is understood that the specific methods, materials, conditions, process parameters, apparatus and the like do not necessarily limit the scope of the invention.

Deformable substrates of polyethylene (PET), with ITO predeposited thereon in a blanket layer to a thickness of about 140-150 nm was obtained from CPFilms, Inc. of Martinsville, Va. The ITO was patterned into square islands of various sizes and with various fill factors, as described in Table 1 below. Islands with sides of 20 microns, 50 microns, 80 microns, 100 microns, and 120 microns were patterned, with fill factors of 44%, 25%, 16%, 9% and 4%. These islands may be referred to as having a "largest dimension" that is the diagonal dimension across the square, i.e., the length of the side times the square root of 2. Gold interconnects were then deposited and patterned by lift-off. The gold interconnects were 35 microns wide, and 120 nm thick. An organic layer of an OLED was then deposited. The organic layer included 2 coats of PEDOT spun on at 2000 rpm for 40 seconds per coat, for a PEDOT thickness of 250 nm (PEDOT thickness based on measurements using silicon wafers). The organic layer also included 10 nm of CuPc, 50 nm NPD, and 50 nm $Alq_3$, blanket deposited by thermal evaporation in an e-beam system, in that order, over the PEDOT. A second inorganic layer was deposited over the organic layer. The second inorganic layer included 0.5 nm LiF and 100 nm Al, deposited in that order by thermal evaporation in an e-beam system. These devices are described below as "Sample A, with OLED." Similar devices were fabricated for comparison purposes that did not include the organic layer or the second inorganic layer ("Sample B, without OLED").

The substrates on which the devices were formed were deformed, in a manner similar to that illustrated in FIGS. 3 and 4. The deformation was to a nominal radial strain of 1.5% achieved over 50 minutes. The deformation was performed at 80 degrees C., which is just above the 76 degrees C. glass transition temperature of PET, but still significantly below the thin-film glass transition temperature of the organic materials in the OLED. The circular ring used to clamp the substrate during deformation had an inner diameter of 6 cm. It is believed that, when OLED materials are in a thin film, the glass transition temperature may be higher than it is for the same materials in bulk. It is expected that the substrate strain under the islands was much reduced below the nominal strain, and that strain was concentrated in the interstices between the islands. The yields for the various island sizes and fill factors are described in Table 1. "Yield" refers to the percentage of devices that did not crack upon deformation of the substrate.

TABLE 1

| FF/Size | 20 :m | 50 :m | 80 :m | 100 :m | 120 :m |
|---|---|---|---|---|---|
| Sample A (with OLED) | | | | | |
| 44% | 100% | 100% | 91% | 79% | 59% |
| 25% | 100% | 99% | 92% | 77% | 61% |
| 16% | 100% | 98% | 96% | 83% | 62% |
| 9% | 100% | 99% | 95% | 82% | 62% |
| 4% | 100% | 100% | 92% | 84% | 61% |
| Sample B (without OLED) | | | | | |
| 44% | 100% | 95% | 64% | 31% | 19% |
| 25% | 100% | 98% | 73% | 42% | 20% |
| 16% | 100% | 98% | 70% | 34% | 20% |
| 9% | 100% | 98% | 64% | 36% | 12% |
| 4% | 100% | 100% | 74% | 41% | 6% |

Devices fabricated on islands with a dimension of 50:m and 20:m had yields near 100%, and there was no statistically significant difference in the yield of structures with the OLED and without the OLED at these sizes, showing that for small enough islands, fracture may not be an issue.

Devices similar to those described above were fabricated, but with some differences. Sample C was similar to Sample A, but had 300 nm thick aluminum interconnects instead of 120 nm thick gold interconnects. Sample C had no PEDOT. Sample D was identical to sample C, but with the $Alq_3$ thickness increased to 100 nm. It was observed that the aluminum interconnects cracked upon deformation in Sample C, but not in Sample D, illustrating that a thicker organic layer may have superior crack suppression properties as compared to a thinner organic layer. Sample D also had better island yields than Sample A, illustrating that a thicker organic layer may have an increased beneficial effect on island yield.

TABLE 2

| FF/Size | 20 :m | 50 :m | 80 :m | 100 :m | 120 :m |
|---|---|---|---|---|---|
| 44% | 100% | 100% | 94% | 86% | 68% |
| 25% | 100% | 100% | 99% | 80% | 70% |
| 16% | 100% | 100% | 100% | 89% | 61% |
| 9% | 100% | 100% | 100% | 86% | 80% |
| 4% | 100% | 100% | 100% | 81% | 67% |

EXAMPLES

Preparation of Substrates

1. Elastomer substrates were prepared by mixing a polymer base with curing agents in a controlled weight ratio. Sylgard 184 silicone elastomer was used as a compliant substrate. The controlled weight ratio was 10:1 for the Sylgard 186 silicone rubber. Substrates about 0.5 mm to 1 mm thick were prepared in a dish and cured several hours in a controlled temperature oven. The curing time and temperature depend on the polymer. The Sylgard 184 substrates used were 1-mm thick and were cured at 60. degree. C. for at least 12 hours after de-airing.

2. Thin elastomer substrates tens of a micrometer thick can be prepared by spin casting onto a rigid holder, such as a glass slide or a silicon wafer and cured afterwards. Thin elastomer substrates can also be prepared by pre-stretching millimeter thick elastomer films.

3. Plastic substrates are commercially available in a wide range of thicknesses.

Preparation of Conductive Film

A conductive film of a metallic bi-layer of chromium (Cr) and gold (Au) was prepared by e-beam evaporation in a Denton/DV-502A evaporator. The base pressure in the chamber was $4\times10^{-6}$ torr prior to the evaporation and $8\times10^{-6}$ torr during evaporation. The Au deposition rate was ~2 Å/s. The temperature of the sample holder does not exceed 50° C. during the metal evaporation. In a single run, a 5 nm thick bonding layer of chromium and then a layer of Au were evaporated onto the substrate. Different Au film thicknesses were selected in the 25-100 nm range. It was found that a layer of Au thicker than 100 nm was not stretchable.

Results

1. Stretching of Conductive Film

Figure 23:
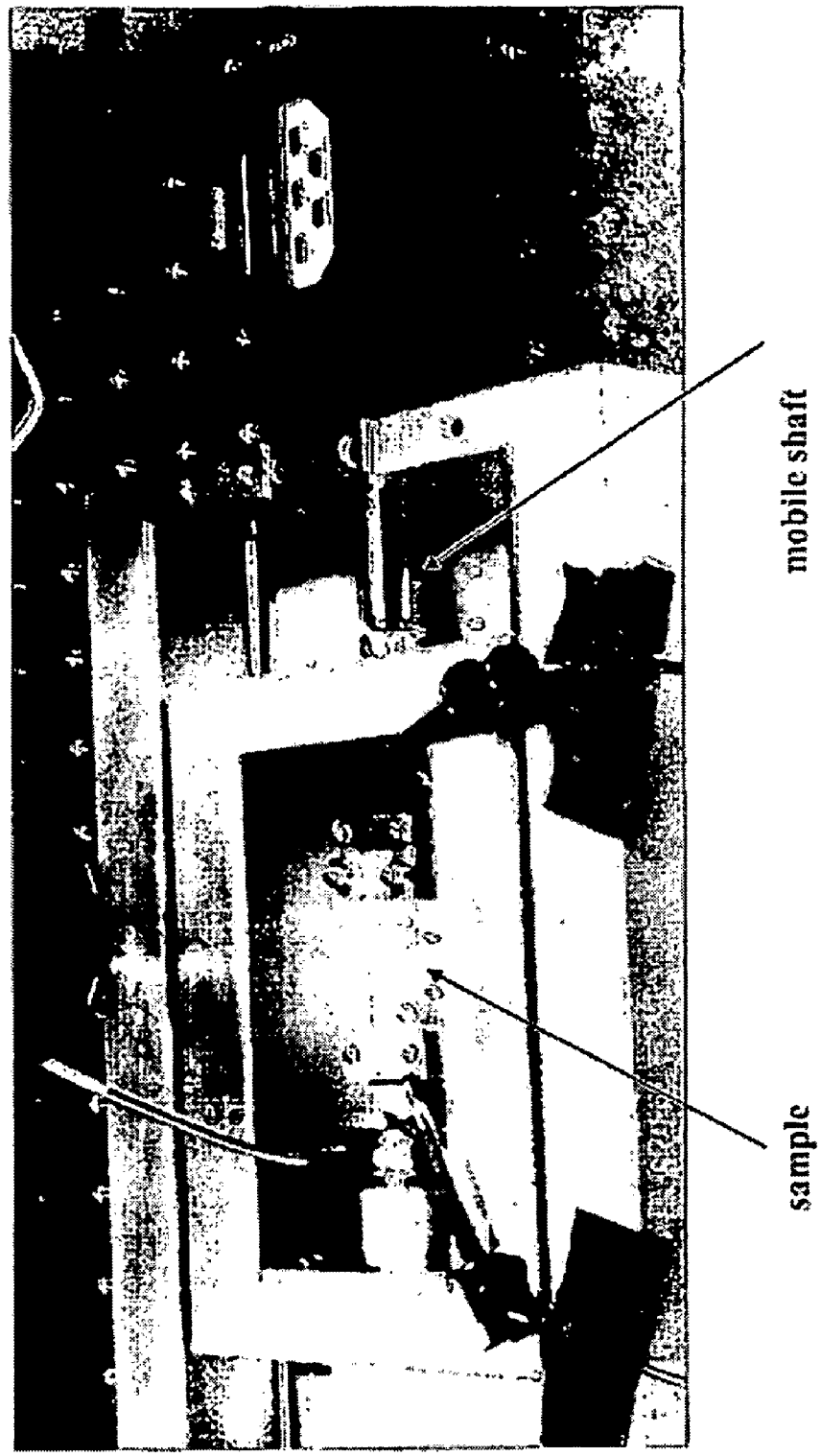
FIG. 23 is a pictorial view of a combined strain and electrical resistance tester used to record the electromechanical behavior of the stretchable interconnect.
Figure 24:
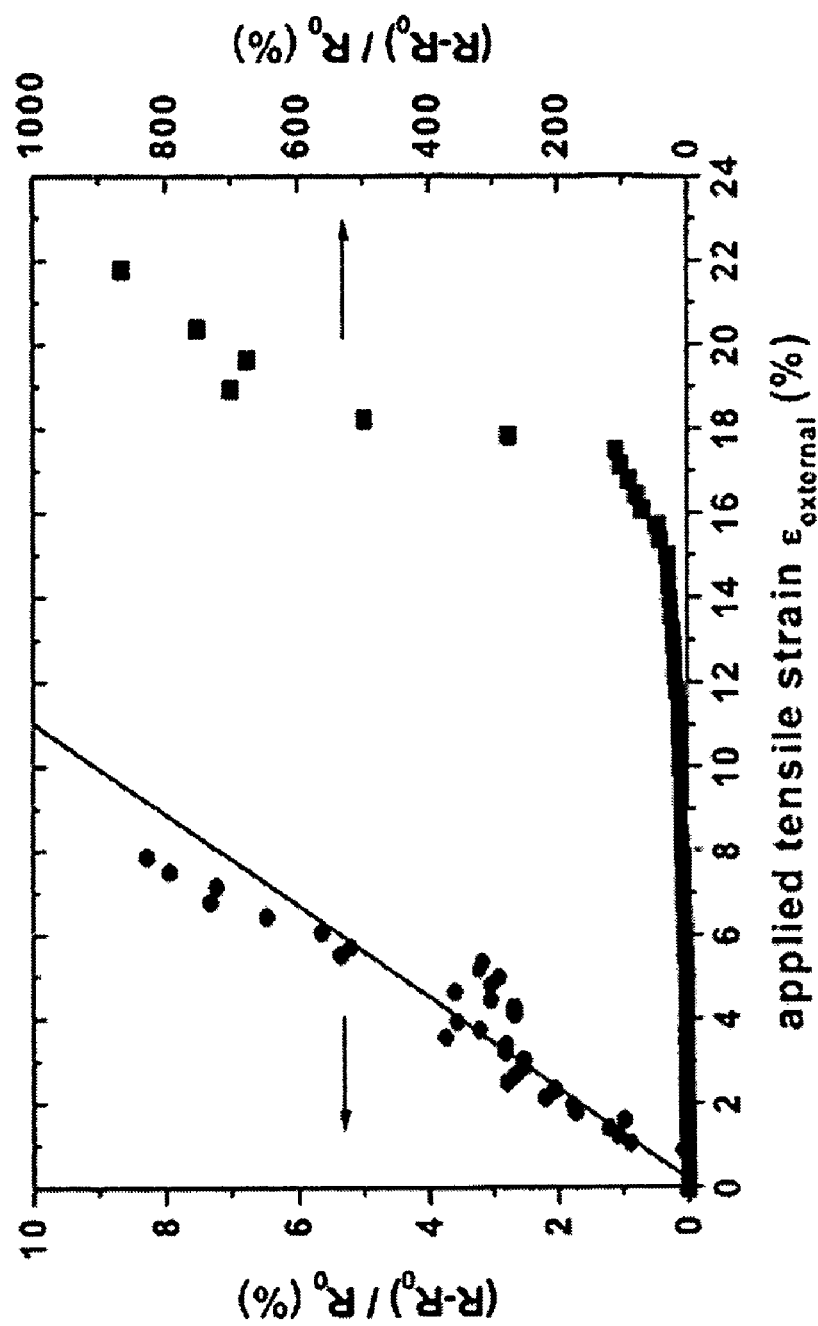
FIG. 24 is a graph of the variation of the normalized change in electrical R of an interconnect with applied tensile strain.

Electrical resistance of stretchable interconnect 10 while under mechanical strain was evaluated. Electrical contact of conducting epoxy paste were applied, and 0.1 mm diameter gold wires were embedded in the paste. The paste burying the wires was sandwiched between substrate 16 formed of PDMS and applied conductive stripe 20 and a second piece of PDMS to ensure electrical connection as well as mechanical compliance. A sample is shown in FIG. 23 mounted under a microscope in a strain tester and with electrical leads. Conductive stripe 20 was formed of Au and is 100 nm thick, 28 mm long and 0.25 mm wide. The electrical resistance as a function of uniaxial strain was measured in situ using a Keithley 4210 source meter. The lengthening of the sample and eventual development of cracks in the Au stripe were recorded with an Infinity Long Distance K2 microscope, a Kodak digital camera, and an XYZ translation platform. The elongation was measured with a 1 μm resolution Mitutoyo meter. From this elongation $L-L_0$, the values of externally applied strain $\epsilon_{external}=(L-L_0)L_0$ are calculated from the difference of the sample length, L to its unstressed length, $L_0$. The electrical resistance was first measured without external strain. Then the sample was elongated, first in 0.18% steps of X % and beyond X %=6% in 0.36% steps, and was held for 5 minutes at each strain value. FIG. 24 presents the change in electrical resistance $(R-R_0)/R_0$ normalized to its initial value as shown in curve 80 with applied tensile strain. Curve 82 represents the linear behavior of $(R-R_0)/R_0$ for strain lower than 8%.

After mounting in the test frame and in the absence of externally applied strain, the Au stripe of FIG. 24 was buckled as shown in FIG. 13. The surface of the sample became flat after the first two 0.18% steps=0.36% external strain were applied; it was free of cracks. Because the calculated critical strain $\epsilon_c$ is only 0.015%, the initial compressive strain in the gold film $\epsilon_0$ is near 0.36%.

Resistance under tension was measured. It was expected to reach a maximum value of tensile strain in the electrically continuous film of ~1%. FIG. 24 shows that, surprisingly, the Au line remains conducting under $\epsilon^{external}$ much above this typical fracture strain of a free-standing thin film. FIG. 24 exhibits two regimes. At strains lower that ~8% $(R-R_0)/R_0$ is proportional to elongation. In this regime small cracks appear at the edges of the stripe as shown in FIG. 25A. FIG. 25A is a photograph of a 100 nm Au stripe on a 1 mm thick substrate of PDMS at a 8% tensile strain. At higher strain cracks extend across much of the width of the stripe, perpendicular to its long dimension and visible in FIG. 25B. FIG. 25B is a photograph of a 100 nm Au stripe on a 1 mm thick substrate of PDMS at a 16% tensile strain. These longer cracks cause a pronounced rise of the electrical resistance. At strains above 15%, these cracks traverse the full width of the Au line. It has been found that while the electrical resistance rises drastically, it remains finite. This observation suggests that the film is broken, but that a thin conductive layer remains at the bottom of the cracks. From the crack dimensions it is estimated that this conducting remnant layer is one metal atom thick. At $\epsilon_{external}=23\%$ the resistance became infinite.

2. Bending of Conductive Film

Five samples were prepared on a 1-mm thick PDMS substrate with thickness from 25 to 400 nm, in accordance with the technique of FIGS. 7A-7C. All Au layers are flat.

Figure 26:
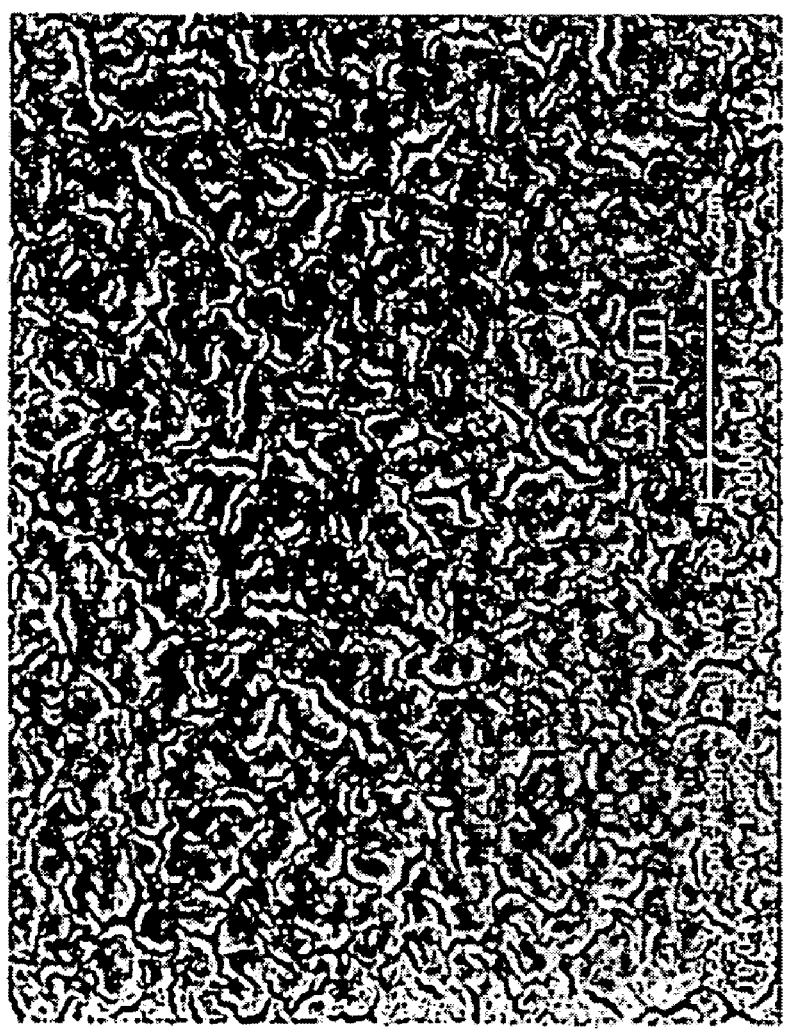
FIG. 26 is a scanning electronic micrograph of a stretchable interconnect formed in accordance with FIGS. 7A-7C.

The initial electrical resistance $R_0$ was measured for each film before deformation. All samples conduct but their resistance is higher than the value $R_{th}$ calculated from the dimension of the Au stripes by at least one order of magnitude. The surface topography was analyzed by scanning electron micrographs (SEM). FIG. 26 shows the surface of a 100 nm thick Au sample. It is shown that the Au layer, which appeared smooth under the optical microscope contains a network of tiny cracks. Each crack is Y-shaped, about 1 μm long and 50 to 100 nm wide. It is shown that the cracks are not connected to each other. The micro-cracks appear immediately after the gold evaporation and are found on all samples. The high initial resistance values can be a result of the presence of the micro-cracks running in the Au film. The cracks increase the electrical length of the line and shrink the layer cross section.

Figure 27:
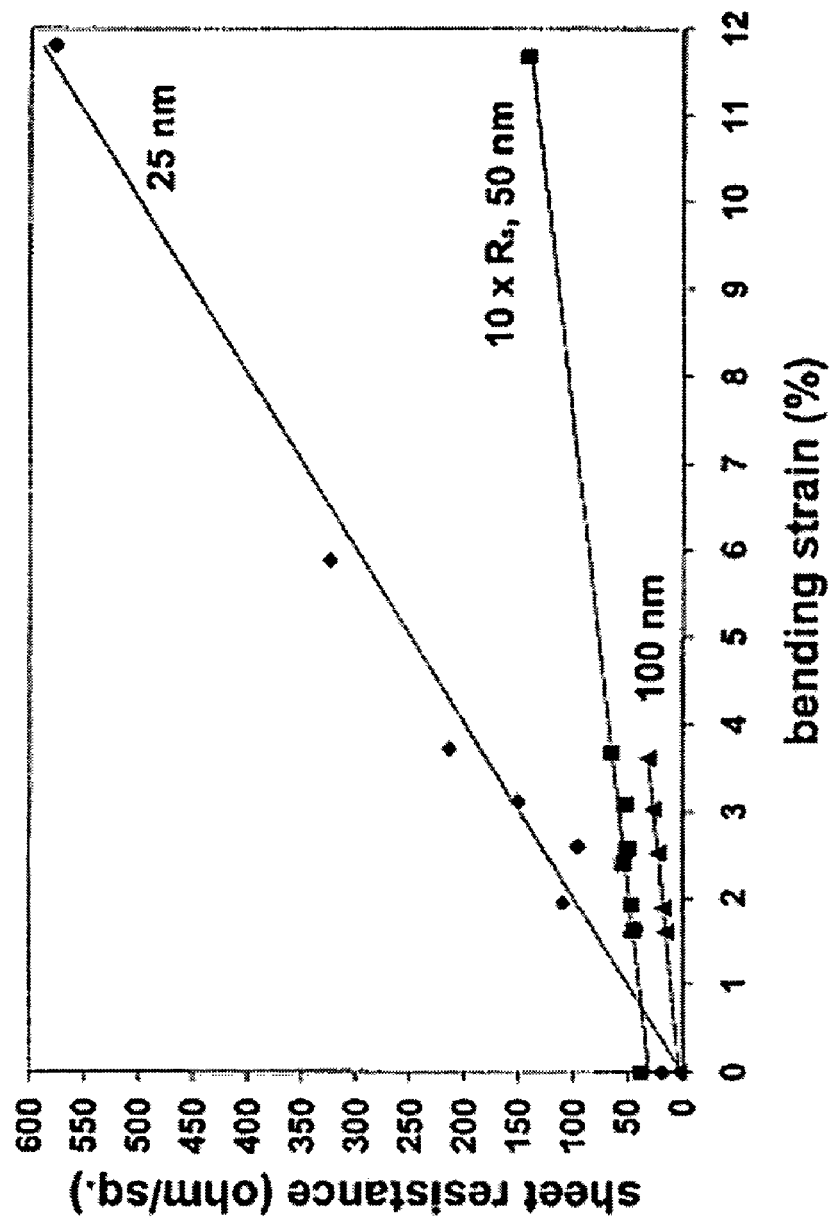
FIG. 27 is a graph of an electrical resistance versus bending strain for three thicknesses of a conductive film.

The electrical resistance of the Au line was recorded as a function of bending strain with the following protocol: each sample placed on a curved tube section for 30 min and its resistance is measured, then the sample is laid flat for another 30 min and its resistance is recorded. Then the sample is placed on a tube with a smaller radius for larger strain. The results for three Au thicknesses of 25 nm, 50 nm and 100 nm are shown in FIG. 27 as the sheet resistance $R_s$ in Ω/☐ is plotted versus the strain induced by bending.

It was found that in Au films thicker than 100 nm at tensile strain higher than 1%, transversal cracks formed across the sample and cut the electrical path. Samples thinner than 100 nm remained electrically conducting for strains much beyond the typical fracture strain of thin metal film of ~1%. 25 and 50 nm thick samples remained conducting at strain of up to 12%. It was found that in all cases, the resistance increases linearly with strain.

Figure 28:
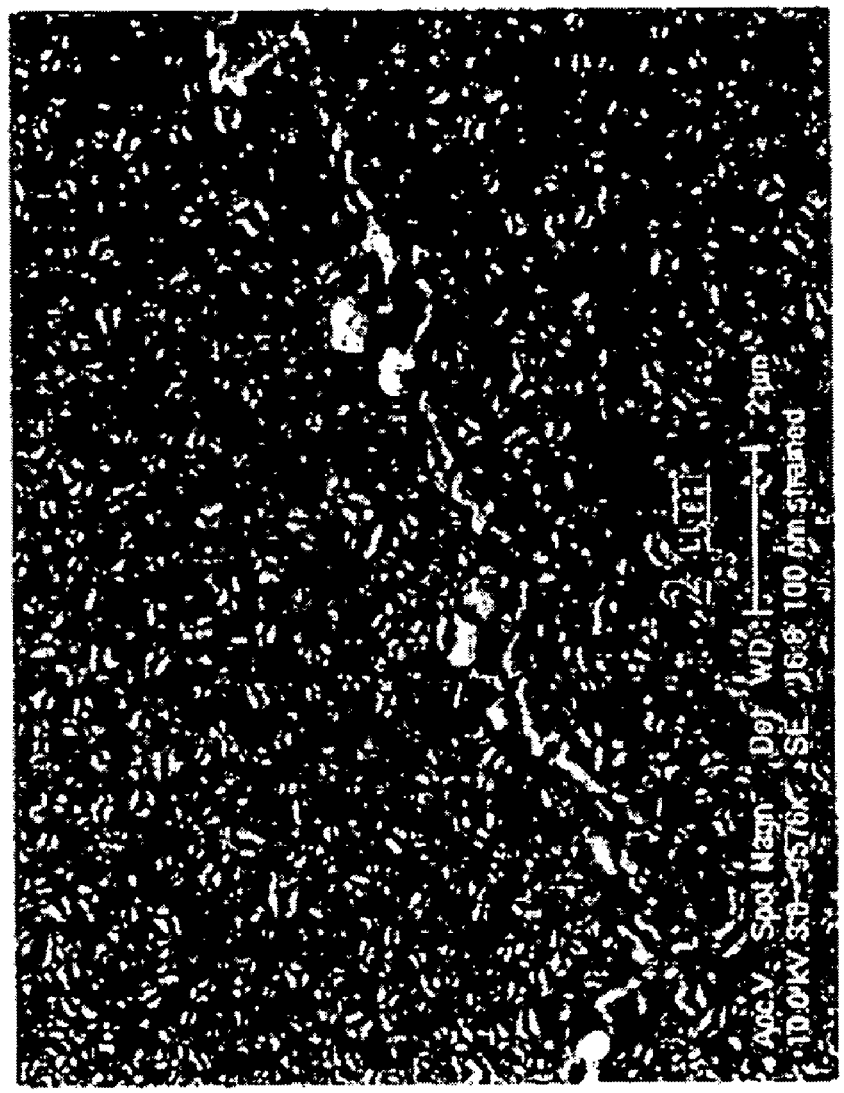
FIG. 28 is a scanning electronic micrograph of a stretchable interconnect formed in accordance with FIGS. 7A-7C after bending to 4%.

FIG. 28 shows a portion of the 100 nm thick sample after 4% tensile deformation. It is shown that large cracks appear during bending. The large cracks are hundreds of μm long and form perpendicularly to the straining direction. The small cracks described above remain. During elongation, some of the small cracks are observed to merge and propagate but do not extent over the entire width. The electrical resistance remains finite.

Between each tensile deformation, the Au stripe is let to relax for 30 min while flat. The "flat" electrical resistance is then recorded. It was found that less than 5% scatter, except for the 25-nm thick sample. During relaxation, the elastic PDMS substrate pulls the cracks close, and film fragments at the edges of the cracks tend to overlap. The electrical resistance recovers a value close to its initial one. Accordingly, the response of electrical resistance to tensile deformation is reversible.

It is to be understood that the above-described embodiments are illustrative of only a few of the many possible specific embodiments which can represent application so the principles of the invention. Numerous and varied other arrangements can be readily devised in accordance with these principles by those skilled in the art without departing from the spirit and scope of the invention.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device fabricated by the process of:
   depositing an inorganic conductive or semiconductive layer disposed over a substrate, the substrate having an original configuration;
   depositing a non-substrate organic layer on the inorganic conductive or semiconductive layer, such that the organic layer is in direct physical contact with the inorganic conductive or semiconductive layer;
   deforming the substrate such that there is an average radial or biaxial strain of at least 0.05% relative to the original configuration.

2. A method of fabricating a device, comprising:
   depositing an inorganic conductive or semiconductive layer disposed over a substrate, the substrate having an original configuration;
   depositing a non-substrate organic layer on the inorganic conductive or semiconductive layer, such that the organic layer is in direct physical contact with the inorganic conductive or semiconductive layer;
   deforming the substrate such that there is an average radial or biaxial strain of at least 0.05% relative to the original configuration.

3. The method of claim 2, wherein the substrate is deformed such that there is an average radial or biaxial strain of at least 1.5% relative to the original configuration.

4. The method of claim 3, wherein the original configuration is a flat substrate.

5. The method of claim 2, wherein the substrate is plastically deformed.

6. The method of claim 2, wherein the substrate has a glass transition temperature, and the substrate is deformed at a temperature that exceeds its glass transition temperature.

7. The method of claim 2, wherein the substrate is deformed at a maximum strain rate of 1.5% per 50 minutes.

8. A device, comprising:
   a substrate;
   an inorganic layer disposed over the substrate;
   a non-substrate organic layer disposed on the inorganic layer, such that the organic layer is in direct physical contact with the inorganic layer;
   wherein the substrate is deformed such that there is a nominal axial strain of at least 5% relative to a flat substrate at an interface between the inorganic layer and the organic layer.

9. A device, comprising:
   a substrate;
   an inorganic conductive or semiconductive layer disposed over the substrate;
   a non-substrate organic layer disposed on the inorganic conductive or semiconductive layer, such that the organic layer is in direct physical contact with the inorganic conductive or semiconductive layer;
   wherein the substrate is deformed such that there is a nominal radial or biaxial strain of at least 0.05% relative to a flat substrate at an interface between the inorganic layer and the organic layer.

10. The device of claim 9, wherein the inorganic layer forms islands.

11. The device of claim 10, wherein the islands cover at most 50% of the surface area of the substrate.

12. The device of claim 10, wherein the islands have a largest diameter of at least 70 microns.

13. The device of claim 10, wherein the organic layer is a blanket layer that covers both the inorganic conductive or semiconductive layer that forms an island, and exposed regions of the substrate near the island.

14. The device of claim 9, wherein the device is an organic light emitting device.

15. The device of claim 14, wherein the organic layer further comprises an organic electron transport layer, an organic emissive layer, and an organic hole transport layer.

16. The device of claim 9, wherein the device is a photosensitive organic device.

17. The device of claim 16, wherein the organic layer further comprises a photoactive organic layer.

18. The device of claim 9, wherein the deformed substrate forms a section of a sphere.

19. The device of claim 9, wherein the substrate is deformed such that there is a nominal radial or biaxial strain of at least 1.5% relative to a flat substrate at an interface between the inorganic layer and the organic layer.

* * * * *

UNITED STATES PATENT AND TRADEMARK OFFICE
CERTIFICATE OF CORRECTION

| | |
|---|---|
| PATENT NO. | : 7,465,678 B2 |
| APPLICATION NO. | : 11/332231 |
| DATED | : December 16, 2008 |
| INVENTOR(S) | : Bhattacharya et al. |

It is certified that error appears in the above-identified patent and that said Letters Patent is hereby corrected as shown below:

Column 1, line 10, please replace the paragraph under "GOVERNMENT RIGHTS" with the following amended paragraph:

<u>GOVERNMENT RIGHTS</u>

This invention was made with Government support under Contract No. DAAB07-03-C-P003 awarded by the Army Research Office. The government has certain rights in this invention.

Signed and Sealed this

Thirty-first Day of March, 2009

JOHN DOLL
*Acting Director of the United States Patent and Trademark Office*